US012620965B2

(12) United States Patent
Fukumitsu et al.

(10) Patent No.: US 12,620,965 B2
(45) Date of Patent: May 5, 2026

(54) RESONANCE DEVICE

(71) Applicant: Murata Manufacturing Co., Ltd.,
Nagaokakyo (JP)

(72) Inventors: Masakazu Fukumitsu, Nagaokakyo
(JP); Takehiko Kishi, Nagaokakyo (JP)

(73) Assignee: **MURATA MANUFACTURING CO.,
LTD.**, Nagaokakyo (JP)

( * ) Notice: Subject to any disclaimer, the term of this
patent is extended or adjusted under 35
U.S.C. 154(b) by 911 days.

(21) Appl. No.: 17/939,098

(22) Filed: Sep. 7, 2022

(65) Prior Publication Data

US 2023/0008378 A1      Jan. 12, 2023

Related U.S. Application Data

(63) Continuation of application No.
PCT/JP2020/042808, filed on Nov. 17, 2020.

(30) Foreign Application Priority Data

Apr. 24, 2020      (JP) ................................. 2020-077316

(51) Int. Cl.
*H03H 9/17* (2006.01)
*H03H 9/13* (2006.01)
*H10N 30/88* (2023.01)

(52) U.S. Cl.
CPC .............. *H03H 9/173* (2013.01); *H03H 9/13*
(2013.01); *H10N 30/88* (2023.02)

(58) Field of Classification Search
CPC ........... H03H 9/173; H03H 9/13; H10N 30/88
See application file for complete search history.

(56) References Cited

U.S. PATENT DOCUMENTS

| | | | | |
|---|---|---|---|---|
| 2019/0074812 A1* | 3/2019 | Inoue | .................... | B81B 3/0072 |
| 2019/0089321 A1* | 3/2019 | Morinaga | ............ | H03H 9/1014 |
| 2020/0244222 A1* | 7/2020 | Umeda | .................... | H03B 5/36 |
| 2020/0252048 A1* | 8/2020 | Fujii | ........................ | H03H 9/10 |
| 2020/0313070 A1* | 10/2020 | Yokoyama | ............ | H10N 30/88 |
| 2020/0391999 A1* | 12/2020 | Fukumitsu | .............. | B81C 3/001 |

FOREIGN PATENT DOCUMENTS

| | | |
|---|---|---|
| WO | 2017212677 A1 | 12/2017 |
| WO | 2019225047 A1 | 11/2019 |

OTHER PUBLICATIONS

International Search Report issued for PCT/JP2020/042808, date of
mailing Feb. 9, 2021.

* cited by examiner

*Primary Examiner* — Bryan P Gordon
(74) *Attorney, Agent, or Firm* — ArentFox Schiff LLP

(57) ABSTRACT

A resonance device is provided that includes a lower lid that
has a recessed portion, and a resonator that is mounted on the
lower lid and has a vibration arm that performs out-of-plane
bending vibration in a space including the recessed portion
and a frame provided around the vibration arm and having
a facing portion facing a tip of the vibration arm. The facing
portion of the frame is located in an outer-side portion of the
resonator with respect to a straight line connecting an
intersection point of a perpendicular extending from the tip
of the vibration arm toward the recessed portion of the lower
lid and the recessed portion of the lower lid, to a cavity edge
of the recessed portion facing the tip of the vibration arm.

20 Claims, 16 Drawing Sheets

FIG. 15

RESONANCE DEVICE

CROSS REFERENCE TO RELATED APPLICATIONS

This application is a continuation of PCT Application No. PCT/JP2020/042808, filed Nov. 17, 2020, which claims priority to Japanese Patent Application No. 2020-077316, filed Apr. 24, 2020, the entire contents of each of which are hereby incorporated by reference in their entirety.

TECHNICAL FIELD

The present invention relates to a resonance device.

BACKGROUND

Currently, a resonator, such as piezoelectric vibrator, is used as a device that realizes a clock function in an electronic device. Resonators are required to be reduced in size accompanying size reduction of electronic devices, and resonators manufactured using micro electro mechanical systems (MEMS) technology (hereinafter, also referred to as MEMS vibrators) are attracting attention.

For example, International Publication No. 2017-212677 (hereinafter "Patent Document 1") describes a configuration in which, by excessively exciting a vibration arm, an adjustment film in the vibration arm is caused to collide with at least one of the bottom plate of the upper lid and the bottom plate of the lower lid to scrape the adjustment film so as to reduce the weight of the vibration arm and adjust the resonant frequency of the resonator.

However, in the related art, when the vibration arm is excessively excited, such that the adjustment film scatters from the vibration arm and enters a gap between the upper lid and the resonator or the inner wall of the resonator, an insulation failure may occur.

Moreover, this problem similarly occurs not only when the vibration arm is excessively excided, but also when the resonant frequency of the vibration arm is adjusted for the resonator that is joined to the lower lid by trimming the adjustment film using an ion beam or the like.

SUMMARY OF THE INVENTION

Accordingly, it is an object of the present invention to provide a resonance device that suppresses an occurrence of an insulation failure due to a scattering object from the vibration arm when the resonant frequency of the vibration arm is adjusted.

In an exemplary aspect, a resonance device is provided that includes a lower lid that has a first recessed portion, and a resonator that is mounted on the lower lid and has a vibration arm configured to perform out-of-plane bending vibration in a space including the first recessed portion and a frame provided around the vibration arm and having a facing portion facing a tip of the vibration arm, in which the facing portion of the frame is located in an outer-side portion of the resonator with respect to a straight line connecting an intersection point of a perpendicular extending from the tip of the vibration arm toward the first recessed portion of the lower lid and the first recessed portion of the lower lid, to a cavity edge of the first recessed portion facing the tip of the vibration arm.

According to the exemplary embodiment of the present invention, when the resonant frequency of a vibration arm is adjusted, the occurrence of an insulation failure due to a scattering object from the vibration arm is suppressed.

BRIEF DESCRIPTION OF DRAWINGS

FIG. 15 is a diagram for explaining a function of the resonance device according to the fifth exemplary embodiment.

DETAILED DESCRIPTION OF EMBODIMENTS

First Exemplary Embodiment

Figure 1:
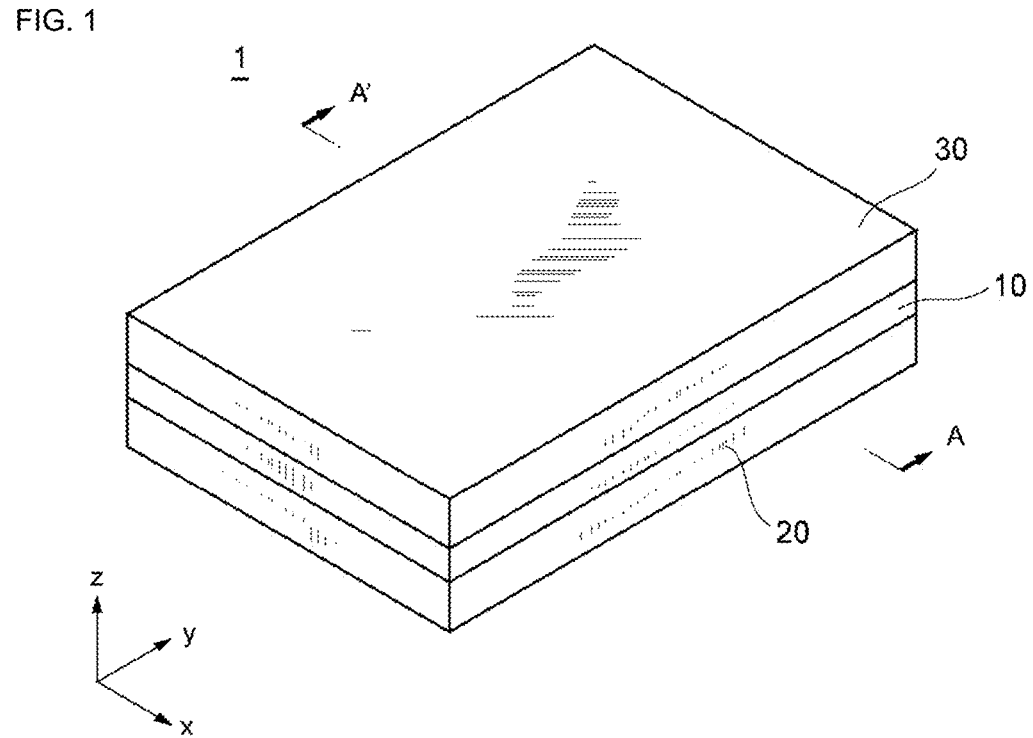
FIG. 1 is a perspective view schematically illustrating an appearance of a resonance device according to a first exemplary embodiment.
Figure 2:
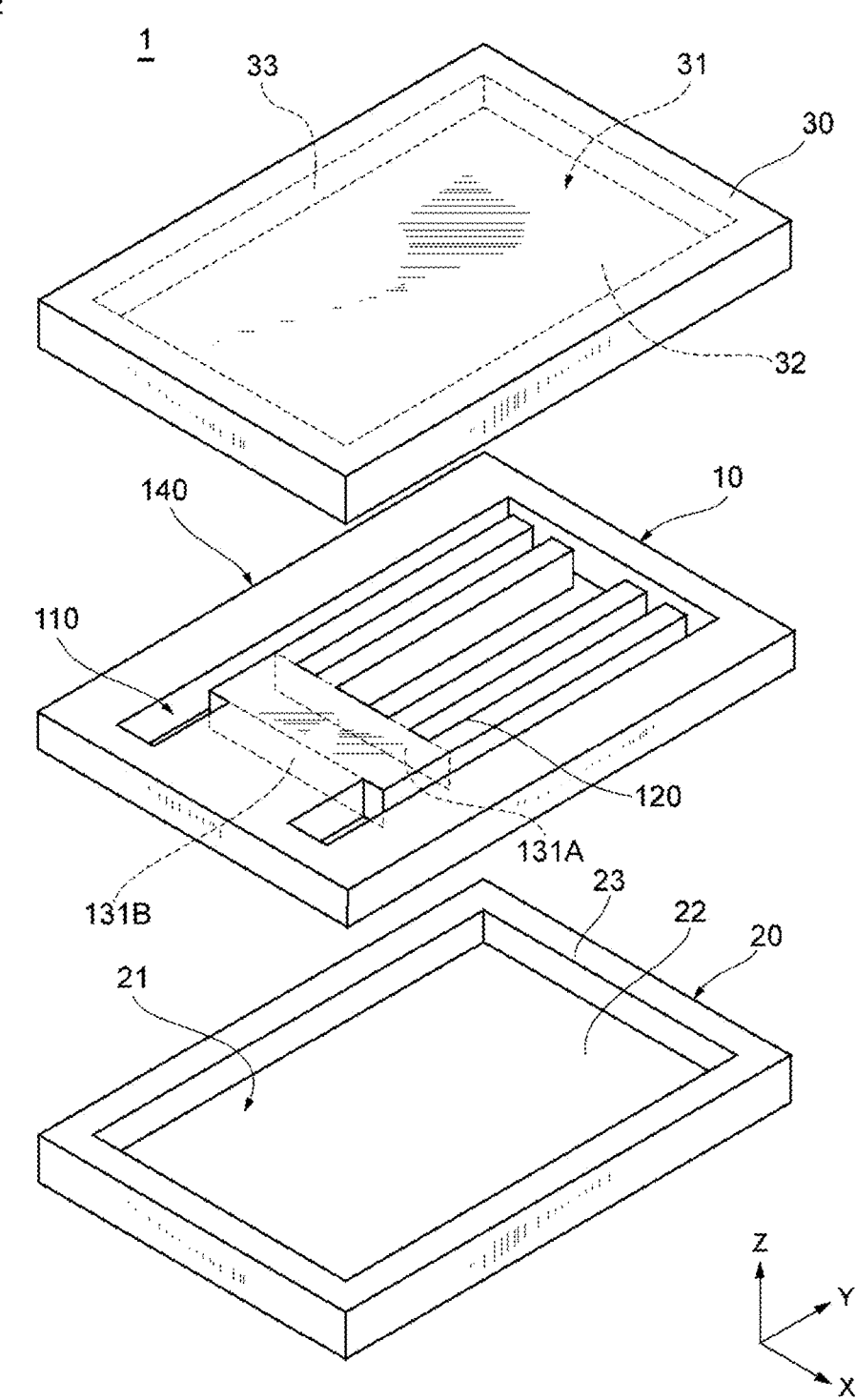
FIG. 2 is an exploded perspective view schematically illustrating a structure of the resonance device according to the first exemplary embodiment.

Hereinafter, a first exemplary embodiment will be described with reference to the accompanying drawings. FIG. 1 is a perspective view schematically illustrating an appearance of a resonance device 1 according to the first exemplary embodiment. In addition, FIG. 2 is an exploded perspective view schematically illustrating a structure of the resonance device 1 according to the first exemplary embodiment.

According to an exemplary aspect, the resonance device 1 includes a resonator 10 and lid bodies (i.e., an upper lid 30 and a lower lid 20) provided so as to face each other across the resonator 10. That is, the resonance device 1 includes the lower lid 20, the resonator 10, and the upper lid 30 laminated in this order.

In addition, the resonator 10, the lower lid 20, and the upper lid 30 are joined, thereby sealing the resonator 10 and forming a vibration space of the resonator 10. Each of the resonator 10, the lower lid 20, and the upper lid 30 is formed using a silicon (Si) substrate. In addition, the Si substrates of the resonator 10, the lower lid 20, and the upper lid 30 are mutually joined. The resonator 10 and the lower lid 20 may be formed using a silicon on insulator (SOI) substrate in an exemplary aspect.

In general, the resonator 10 can be a micro electro mechanical systems (MEMS) resonator manufactured using MEMS technology. Note that in the present embodiment, the resonator 10 that is formed using a silicon substrate will be described as an example. Hereinafter, each configuration of the resonance device 1 will be described in detail.

Upper Lid 30

As shown, the upper lid 30 has a bottom plate 32 having a rectangular flat plate shape and provided along the XY-plane and a side wall 33 extending in the Z-axis direction (that is, a laminating direction of the upper lid 30 and the resonator 10) from a peripheral portion of the bottom plate 32. On the surface facing the resonator 10, the upper lid 30 is provided with a recessed portion 31 (an example of a second recessed portion) formed by a surface of the bottom plate 32 and an inner surface of the side wall 33. The recessed portion 31 forms a part of the vibration space in which the resonator 10 vibrates.

Lower Lid 20

Moreover, the lower lid 20 has a bottom plate 22 having a rectangular flat plate shape and provided along the XY-plane and a side wall 23 extending in the Z-axis direction (that is, a laminating direction of the lower lid 20 and the resonator 10). On the surface facing the resonator 10, the lower lid 20 is provided with a recessed portion 21 (an example of a first recessed portion) formed by a surface of the bottom plate 22 and an inner surface of the side wall 23. The recessed portion 21 forms a part of the vibration space of the resonator 10. By the upper lid 30 and the lower lid 20 described above, the vibration space is sealed in an air-tight manner, and a vacuum state is maintained. In an exemplary aspect, the vibration space may be filled with gas such as inert gas, for example.

Resonator 10

Figure 3:
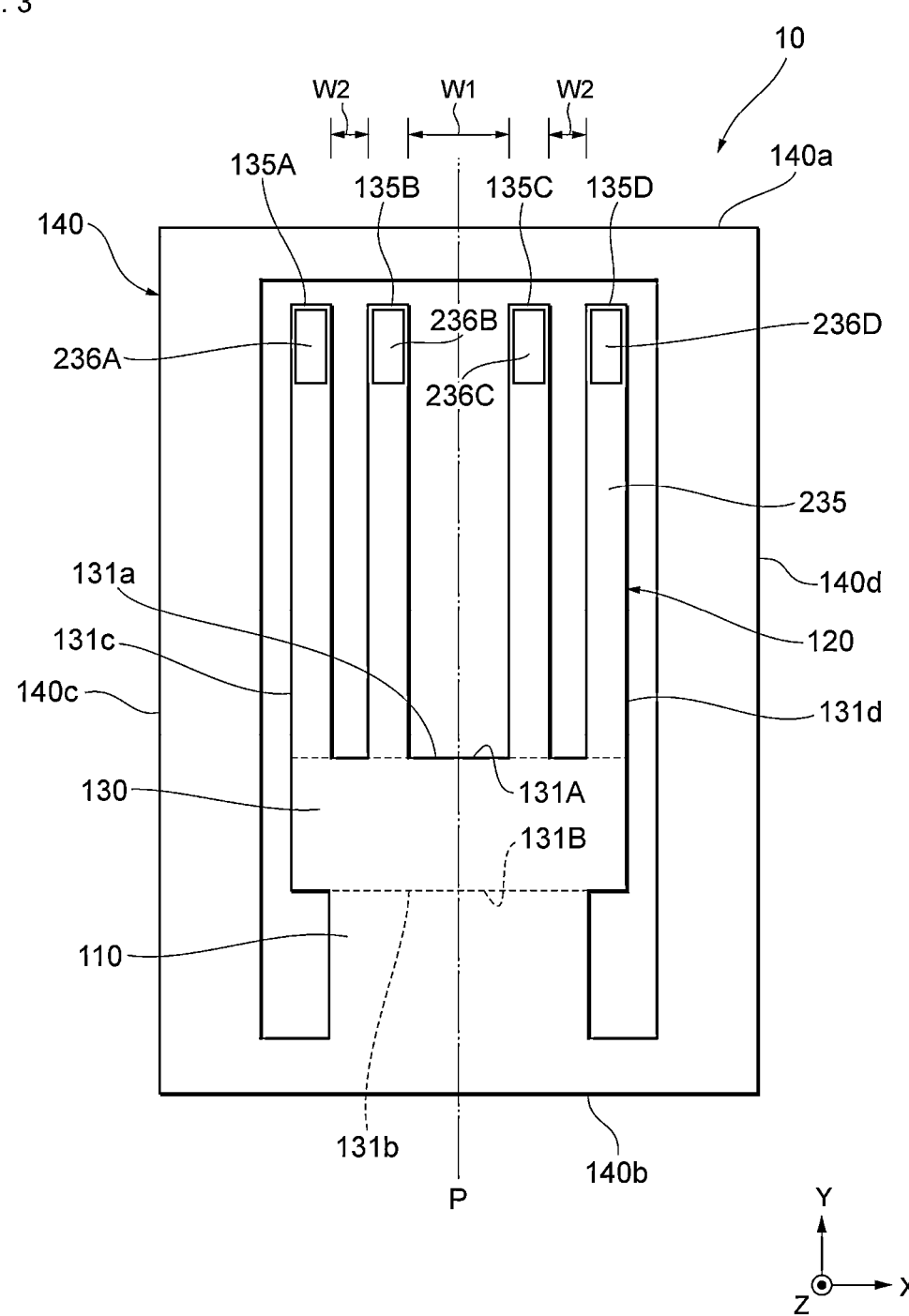
FIG. 3 is a plan view of a resonator according to the first exemplary embodiment from which an upper side substrate is removed.

FIG. 3 is a plan view schematically illustrating a configuration of the resonator 10 according to the present embodiment. With reference to FIG. 3, each configuration of the resonator 10 according to the present embodiment will be described. The resonator 10 includes a vibration portion 120 (e.g., a vibrator), a holding portion 140 (e.g., a frame), and a holding arm 110.

Vibration Portion 120

The vibration portion 120 has a rectangular contour expanding along the XY-plane in the orthogonal coordinate system of FIG. 3. The vibration portion 120 is disposed inside the holding portion 140, and a space is formed at a predetermined interval between the vibration portion 120 and the holding portion 140. In the example of FIG. 3, the vibration portion 120 has a base portion 130 (or simply a "base") and four vibration arms 135A to 135D (also collectively referred to as a vibration arm 135 or vibration arms 135). It is noted that the number of the vibration arms is not limited to four and is set to any number equal to or larger than one, for example. Moreover, in the present embodiment, the vibration arms 135 and the base portion 130 are integrally formed.

As further shown, the base portion 130 has a front end surface 131A (hereinafter, also referred to as a front end 131A) and a rear end surface 131B (hereinafter, also referred to as a rear end 131B). The front end 131A and the rear end 131B of the base portion 130 are provided so as to face each other.

The base portion 130 is connected to the vibration arm 135 described later at the front end 131A and is connected to the holding arm 110 described later at the rear end 131B. In the base portion 130, a base portion length, which is the longest distance between the front end 131A and the rear end 131B in a direction from the front end 131A to the rear end 131B, is approximately 40 µm in an exemplary aspect. In addition, in the base portion 130, a base portion width, which is in a width direction orthogonal to the base portion length direction and is the longest distance between the side ends of the base portion 130, is approximately 300 µm in an exemplary aspect.

The vibration arms 135 extend in the Y-axis direction and each of the vibration arms 135 has the same size. Each of the vibration arms 135 is provided in parallel in the Y-axis direction between the base portion 130 and the holding portion 140, and one end thereof is connected to the front end 131A of the base portion 130 and is a fixed end, and the other end is a free end. In addition, each of the vibration arms 135 is provided in parallel at a predetermined interval in the X-axis direction. Note that in the vibration arm 135, for example, the width in the X-axis direction is approximately 50 µm, and the length in the Y-axis direction is approximately 450 µm in an exemplary aspect.

In the vibration portion 120 of the present embodiment, the two vibration arms 135A and 135D are disposed outside and the two vibration arms 135B and 135C are disposed inside. Moreover, an interval W1 between the vibration arms 135B and 135C in the X-axis direction is set to be larger than an interval W2 between the vibration arm 135A (135D) outside in the X-axis direction and the vibration arm 135B (135C) inside adjacent to the vibration arm 135A (135D) outside. The interval W1 is, for example, approximately 25 µm, and the interval W2 is, for example, approximately 10 µm. By setting the interval W2 to be smaller than the interval W1, the vibration characteristics are improved. In addition, for reducing the size of the resonance device 1, the interval W1 may be set to be smaller than the interval W2, or may be set to be equal to the interval W2.

On the surface of the vibration portion 120 (i.e., the surface facing the upper lid 30), a protection film 235 is formed (or otherwise disposed) so as to cover the entire surface. Moreover, on the surfaces of the protection film 235 in the tip portions (also referred to as the "tips") near the free ends of the vibration arms 135A to 135D, adjustment films 236A to 236D (hereinafter, the adjustment films 236A to 236D are also collectively referred to as an adjustment film 236 or adjustment films 236) are formed, respectively. By the protection film 235 and the adjustment film 236, the resonant frequency of the vibration portion 120 can be adjusted.

The adjustment film 236 is formed such that the surface of the adjustment film 236 is exposed in an area in which displacement due to vibration is relatively large in the vibration portion 120. Specifically, the adjustment film 236 is formed in a tip portion of the vibration arm 135. On the other hand, the surface of the protection film 235 is exposed in other areas in the vibration arm 135.

Holding Portion 140

The holding portion 140 (also referred to as a "frame") is formed into a rectangular frame shape along the XY-plane. The holding portion 140 is, in a plan view, provided so as to surround the outside of the vibration portion 120 along the XY-plane. Note that the holding portion 140 may be provided in at least a part of the periphery of the vibration portion 120 and is not limited to having a frame shape. For example, the holding portion 140 may be provided in the periphery of the vibration portion 120 to such a degree that the holding portion 140 can hold the vibration portion 120 and join the upper lid 30 and the lower lid 20.

In the present embodiment, the holding portion 140 is described assuming that the holding portion 140 is covered with the protection film 235, but is not limited thereto, and the protection film 235 does not have to be formed on the surface of the holding portion 140 in an alternative aspect.

Holding Arm 110

The holding arm 110 is provided inside the holding portion 140 and connects the base portion 130 to the holding portion 140. It is noted that the holding arm 110 is not limited to having this configuration, and, for example, the holding arm 110 may be formed of a plurality of arms (for example, two or more arms) having a curved portion in an alternative aspect.

Lamination Structure

Figure 4:
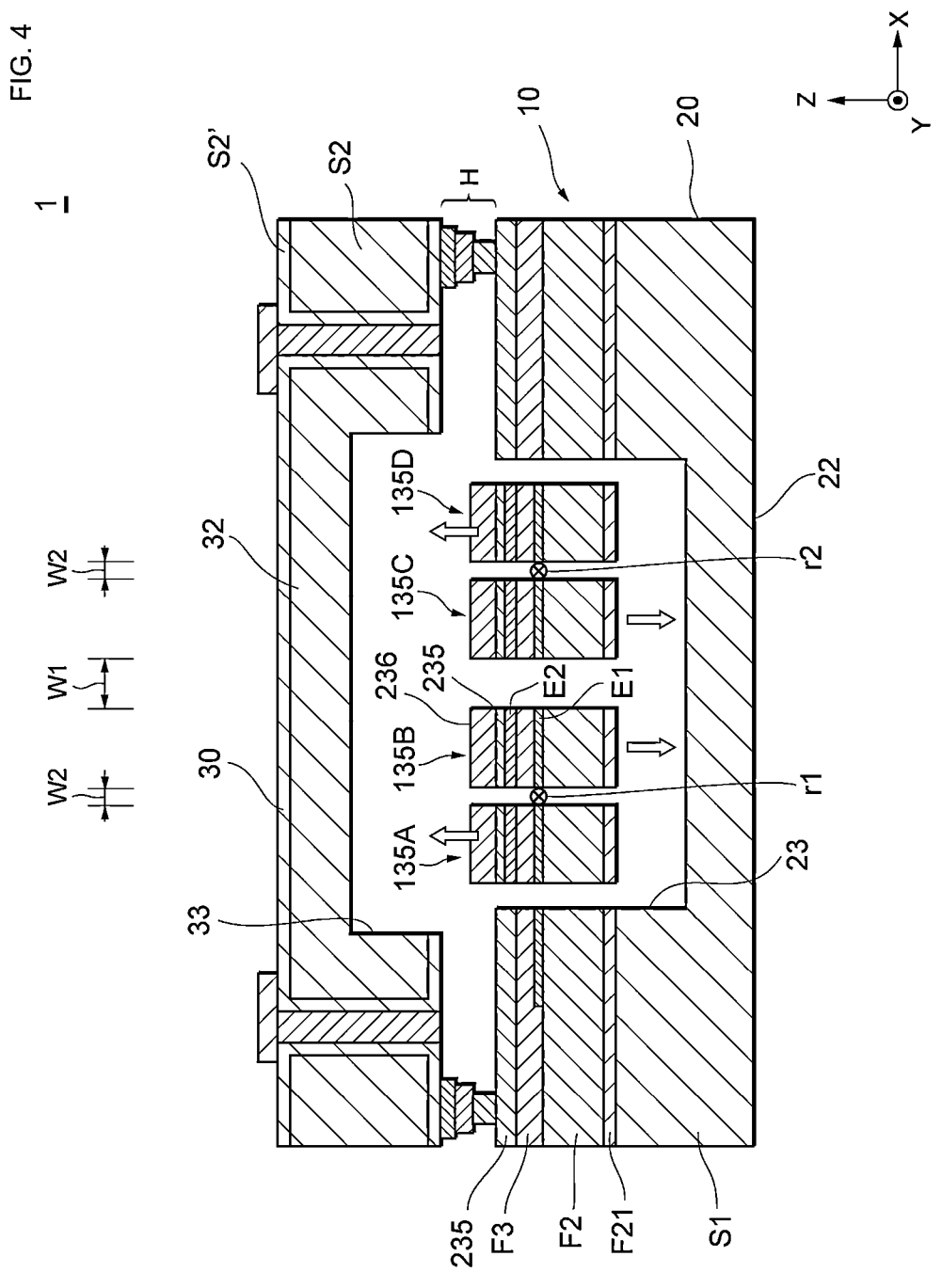
FIG. 4 is a sectional view taken along line A-A' of FIG. 1.
Figure 5:
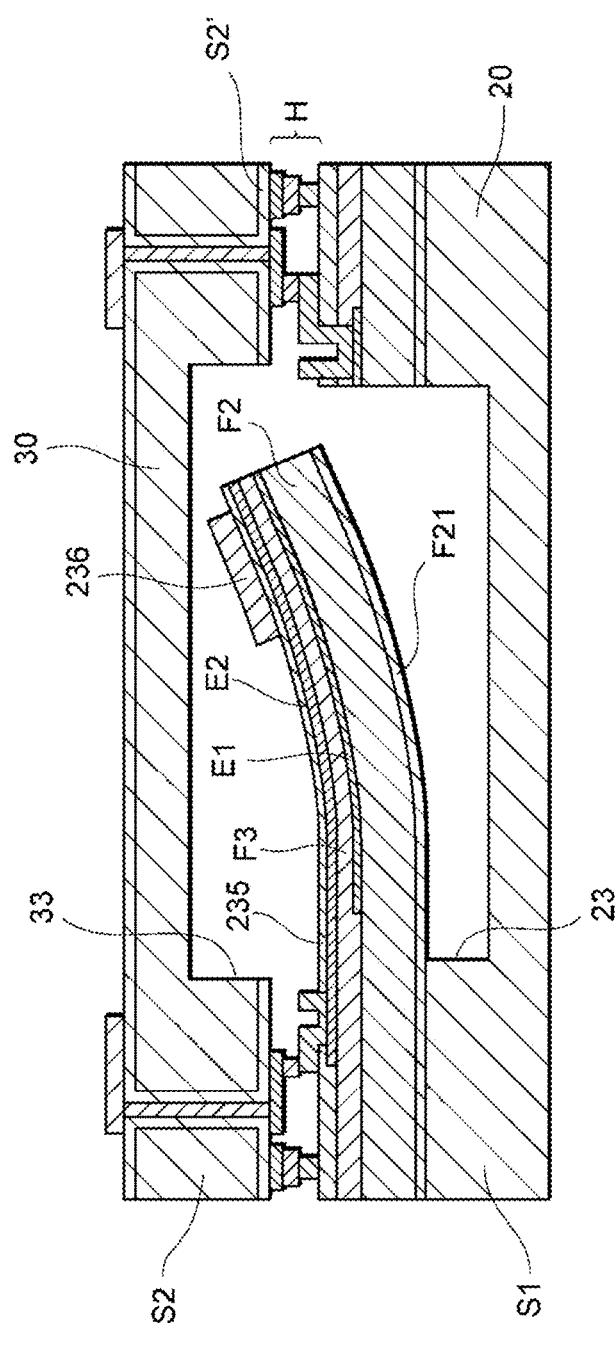
FIG. 5 is a diagram for explaining an example of a frequency adjustment method of a resonator.

With reference to FIG. 4, a lamination structure of the resonance device 1 will be described. FIG. 4 is a sectional view taken along line A-A' of FIG. 1. As illustrated in FIG. 5, in the resonance device 1 according to the present embodiment, the holding portion 140 of the resonator 10 is joined on the side wall 23 of the lower lid 20, and the holding portion 140 of the resonator 10 is further joined to the side wall 33 of the upper lid 30. In this manner, the resonator 10 is held between the lower lid 20 and the upper lid 30, and the vibration space in which the vibration arm 135 vibrates is formed by the lower lid 20, the upper lid 30, and the holding portion 140 of the resonator 10.

In an exemplary aspect, the bottom plate 22 and the side wall 23 of the lower lid 20 are integrally formed of a silicon (Si) wafer S1. In addition, the lower lid 20 is joined to the holding portion 140 of the resonator 10 by the upper surface of the side wall 23. The Si wafer S1 is formed of silicon that is not degenerated, and the resistivity thereof is, for example, equal to or more than 1 kΩ·cm.

In the lower lid 20, the bottom plate 22 of the lower lid 20 is located at a position where displacement due to the vibration of the vibration arm 135 is maximized. In the present embodiment, the thickness of the lower lid 20 defined in the Z-axis direction is, for example, 150 μm, and the depth of the recessed portion 21 is, for example, 50 μm.

Moreover, the upper lid 30 is formed of a silicon (Si) wafer S2 having a predetermined thickness. As illustrated in FIG. 5, the upper lid 30 is joined to the holding portion 140 of the resonator 10 in a peripheral portion (e.g., the side wall 33) of the upper lid 30. The surface facing the resonator 10 and the back surface of the upper lid 30 are preferably covered with a silicon oxide layer S2'. In addition, inside the recessed portion on the surface of the upper lid 30 facing the resonator 10, a getter layer (not illustrated) made of titanium (Ti) may be formed in an exemplary aspect. The getter layer absorbs gas in the vibration space formed by the upper lid 30 and the lower lid 20 by a getter action of titanium so as to make the vibration space into a vacuum state.

In the upper lid 30, the bottom plate 32 of the upper lid 30 is located at a position where displacement due to vibration of the vibration arm 135 is maximized. In the present embodiment, the thickness of the upper lid 30 defined in the Z-axis direction is, for example, 150 μm, and the depth of the recessed portion 31 is, for example, 50 μm.

As further shown in FIG. 4, a joint H is formed between the side wall 33 of the upper lid 30 and the holding portion 140 so as to join the upper lid 30 to the holding portion 140. The joint H is formed of a metal layer of, for example, an aluminum (Al) film, a germanium (Ge) film, or the like. It is also noted that the joint H may be formed of a gold (Au) film and a tin (Sn) film in other exemplary aspects.

In the resonator 10, the holding portion 140, the base portion 130, the vibration arm 135, and the holding arm 110 are integrally formed in the same process. In the resonator 10, first, a metal layer E1 is laminated on a silicon (Si) substrate F2 (which is an example of a substrate). Then, a piezoelectric thin film F3 is laminated on the metal layer E1 so as to cover the metal layer E1, and a metal layer E2 is further laminated on the piezoelectric thin film F3. The protection film 235 is laminated on the metal layer E2 so as to cover the metal layer E2. On the vibration portion 120, the adjustment film 236 is further laminated on the protection film 235.

The Si substrate F2 is formed of, for example, a degenerated n-type Si semiconductor having a thickness of approximately 6 μm and includes, for example, phosphorus (P), arsenic (As), antimony (Sb), or the like as an n-type dopant.

The metal layers E2 and E1 are formed using, for example, molybdenum (Mo) or aluminum (Al) having a thickness of approximately 0.1 μm to 0.2 μm. Moreover, the metal layers E2 and E1 can be formed into a desired shape by etching or the like. In operation, the metal layer E1 functions as a lower electrode (which is an example of a first electrode layer), for example, on the vibration portion 120. In addition, on the holding arm 110 and the holding portion 140, the metal layer E1 functions as wiring for connecting the lower electrode to an AC power source provided outside the resonator 10.

On the other hand, the metal layer E2 functions as an upper electrode on the vibration portion 120. In addition, on the holding arm 110 and the holding portion 140, the metal layer E2 functions as wiring for connecting the upper electrode to a circuit provided outside the resonator 10.

It is noted that for connection from an AC power source to the lower wiring or the upper wiring, a configuration in which an electrode is formed on an outer surface of the upper lid 30 so that the electrode connects the lower wiring or the upper wiring to a circuit, or a configuration in which a via is formed in the upper lid 30, and the via is filled with a conductive material to provide wiring so that the wiring connects the AC power source to the lower wiring or the upper wiring may be adopted.

The piezoelectric thin film F3 is a thin film of a piezoelectric substance that converts an applied voltage to vibration and can contain, for example, a nitride such as aluminum nitride (AlN) and the like or an oxide as a main component. Specifically, the piezoelectric thin film F3 can be formed of scandium aluminum nitride (ScAlN). ScAlN is obtained by replacing a part of aluminum of aluminum nitride with scandium. In addition, although the piezoelectric thin film F3 has, for example, a thickness of 1 μm, the piezoelectric thin film F3 having a thickness of approximately 0.2 μm to 2 μm may also be used in alternative aspects.

In operation, the piezoelectric thin film F3 is configured to expand and contract in an in-plane direction of the XY-plane, that is, in the Y-axis direction according to an electric field applied to the piezoelectric thin film F3 by the metal layers E2 and E1. By the expansion and contraction of the piezoelectric thin film F3, the vibration arm 135 displaces the free end of the vibration arm 135 toward the inner surfaces of the lower lid 20 and the upper lid 30 and vibrates in an out-of-plane bending vibration mode.

In the present embodiment, the phase of the electric field applied to the vibration arms 135A and 135D outside and the phase of the electric field applied to the vibration arms 135B and 135C inside are set so as to be mutually opposite phases. As a result, the vibration arms 135A and 135D outside and the vibration arms 135B and 135C inside are displaced in mutually opposite directions. For example, when the vibration arms 135A and 135D outside displace the free ends toward the inner surface of the upper lid 30, the vibration arms 135B and 135C inside displace the free ends toward the inner surface of the lower lid 20.

The protection film 235 is formed of a material whose mass reduction speed by etching is slower than that of the adjustment film 236. For example, the protection film 235 is formed of a nitride film, such as AlN, SiN, and the like or an oxide film such as tantalum pentoxide (Ta2O5), silicon dioxide (SiO2), and the like. It is noted that the mass reduction speed is expressed by the product of the etching speed (i.e., a thickness removed per unit time) and the density.

In addition, the adjustment film 236 is formed of a material whose mass reduction speed by etching is faster than that of the protection film 235. In addition, the adjustment film 236 is formed of a material whose hardness is at least equal to or less than the hardness of the bottom plate 32 of the upper lid 30. For example, the Vickers hardness of the adjustment film 236 is preferably equal to or less than 2 GPa. On the other hand, the Vickers hardness of the bottom plate 32 is preferably equal to or more than 10 GPa. It is also noted that when the upper lid 30 includes a getter layer, the hardness of the adjustment film 236 is equal to or less than the hardness of the getter layer and is, for example, equal to or less than 0.9 GPa.

For example, the adjustment film 236 is formed of metal, such as molybdenum (Mo), tungsten (W), gold (Au), platinum (Pt), nickel (Ni) and the like.

It is noted that as long as the relation of the mass reduction speed between the protection film 235 and the adjustment film 236 is as described above, any magnitude relation of the etching speed is employed.

It is also noted that etching on the protection film 235 and the adjustment film 236 is performed, for example, by simultaneously irradiating the protection film 235 and the adjustment film 236 with an ion beam (for example, argon (Ar) ion beam). A wider range than the resonator 10 can be irradiated with an ion beam. Note that in the present embodiment, etching by an ion beam is exemplified, but the etching method is not limited to etching by an ion beam.

In the resonance device 1 described above, at the time of vibration in opposite phases, that is, the vibration arm 135A and the vibration arm 135B vibrate in top-bottom directions opposite to each other around a central axis r1, illustrated in FIG. 4, extending in parallel in the Y-axis direction between the vibration arm 135A and the vibration arm 135B. In addition, the vibration arm 135C and the vibration arm 135D vibrate in top-bottom directions opposite to each other around a central axis r2 extending in parallel in the Y-axis direction between the vibration arm 135C and the vibration arm 135D. As a result, torsional moments in mutually opposite directions are generated in the central axes r1 and r2, and bending vibration occurs in the base portion 130.

Process Flow

With reference to FIG. 5, a frequency adjustment method of the resonator 10 according to the present embodiment will be described. In the frequency adjustment method of the resonator 10 according to the present embodiment, by excessively exciting the vibration arm 135 to cause the vibration arm 135 to collide with the upper lid 30 or the lower lid 20, a part of the vibration arm 135 (for example, the piezoelectric thin film F3, the adjustment film 236, the Si substrate F2, or the like) is scraped (e.g., removed) and the weight of the vibration arm 135 changes. Accordingly, by increasing the resonant frequency of the resonator 10, the resonant frequency is adjusted to a desired value by adjusting the weight.

Specifically, in the frequency adjustment method, first, the resonant frequency is measured while a driving voltage having a predetermined value is applied to the resonator 10, and when the resonant frequency is less than the desired value, a voltage larger than the driving voltage having the predetermined value is applied to the resonator 10 to excessively excite the vibration arm 135. Power supplied to the resonator 10 in the frequency adjustment process is, for example, equal to or more than 0.2 µW. Note that excessive excitation refers to causing vibration with amplitude equal to or more than 10 times the usual amplitude of the resonator 10, and specifically, the amplitude during excessive excitation is equal to or more than 50 µm. In addition, the desired value of the resonant frequency is, for example, approximately 32.767 kHz to 32.769 kHz.

By excessively exciting the vibration arm 135, the adjustment film 236 on the vibration arm 135 collides with at least one of the bottom plate 32 (or the getter layer) of the upper lid 30 and the bottom plate 22 of the lower lid 20. Since the bottom plate 32 (or the getter layer) of the upper lid 30 is formed of a material having hardness equal to or more than that of the adjustment film 236, the adjustment film 236 is scraped (or otherwise removed) as the adjustment film 236 collides with the bottom plate 32 (or the getter layer), and the weight of the vibration arm 135 is reduced. Similarly, at least either one of the Si substrate F2 and a silicon oxide layer F21 formed on a surface (e.g., the back surface) of the vibration arm 135 facing the lower lid 20 has hardness approximately equal to or less than that of the bottom plate 22. Therefore, on the back surface of the vibration arm 135 as well, since the Si substrate F2 or the silicon oxide layer F21 is scraped, the mass of the vibration arm 135 is reduced. As a result, the resonant frequency of the resonator 10 is increased by reducing the mass.

After excessively exciting the resonator 10 to cause the resonator 10 to collide with at least one of the upper lid 30 and the lower lid 20, a driving voltage having a predetermined value is applied to the resonator 10 again, and the resonant frequency is measured. By repeatedly measuring the resonant frequency by applying a driving voltage having a predetermined value to the resonator 10 and excessively exciting the resonator 10 by applying a voltage larger than the driving voltage to the resonator 10 until the resonant frequency reaches a desired value, the value of the resonant frequency is adjusted to an appropriate value.

It is noted that as the frequency adjustment method, in addition to the method described above, the weight of the resonator 10 may be changed by scraping a part of the vibration arm 135 (for example, the piezoelectric thin film F3, the adjustment film 236, the Si substrate F2, or the like) by irradiating the resonator 10 with an ion beam having a predetermined pulse width.

US 12,620,965 B2

9

Function of Resonator

Figure 6:
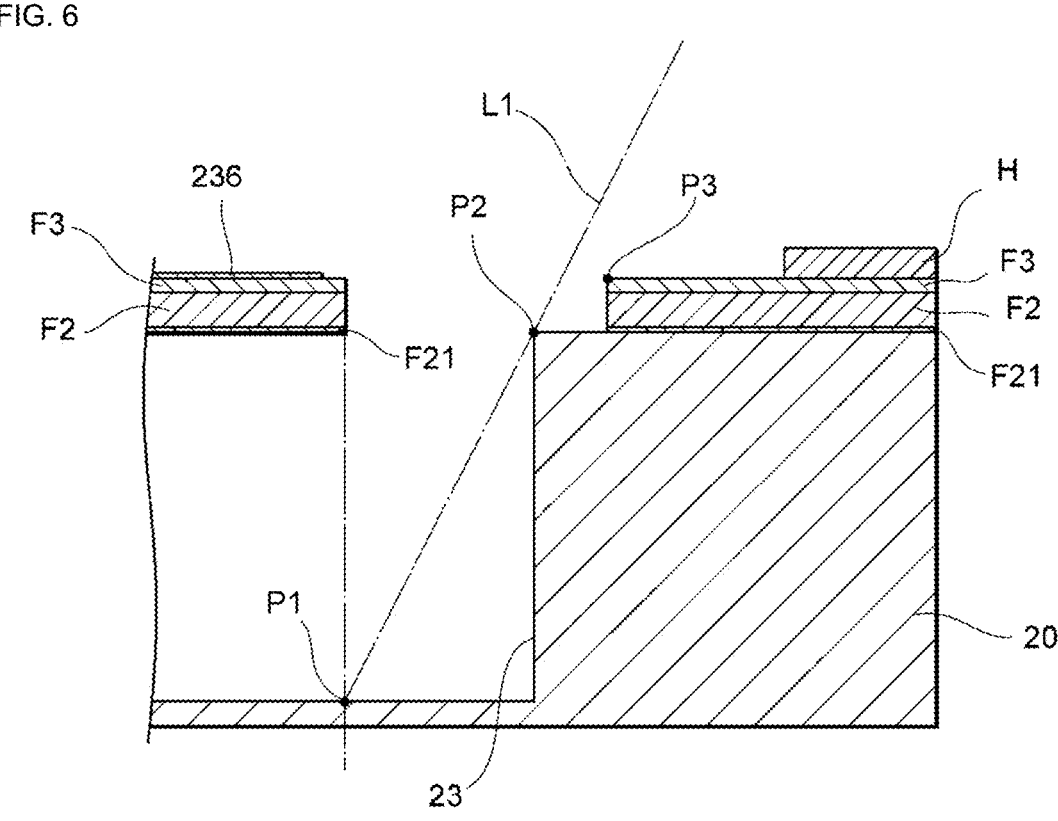
FIG. 6 is a diagram schematically illustrating a main part of the resonance device according to the first exemplary embodiment.

As illustrated in FIG. 6, in the present embodiment, in the resonator 10, a facing portion of the holding portion 140 is located in an outer-side portion of the resonator 10 with respect to a straight line L1 connecting an intersection point P1 of a perpendicular extending from a tip portion of the vibration arm 135 toward the recessed portion 21 of the lower lid 20 and the recessed portion 21 of the lower lid 20, to a cavity edge P2 of the recessed portion 21 facing the tip portion of the vibration arm 135. Specifically, in the reso-nator 10, in the facing portion of the holding portion 140, an inner end portion P3 of the resonator 10 on the piezoelectric thin film F3 is located in the outer-side portion of the resonator 10 with respect to the straight line L1.

Figure 7:
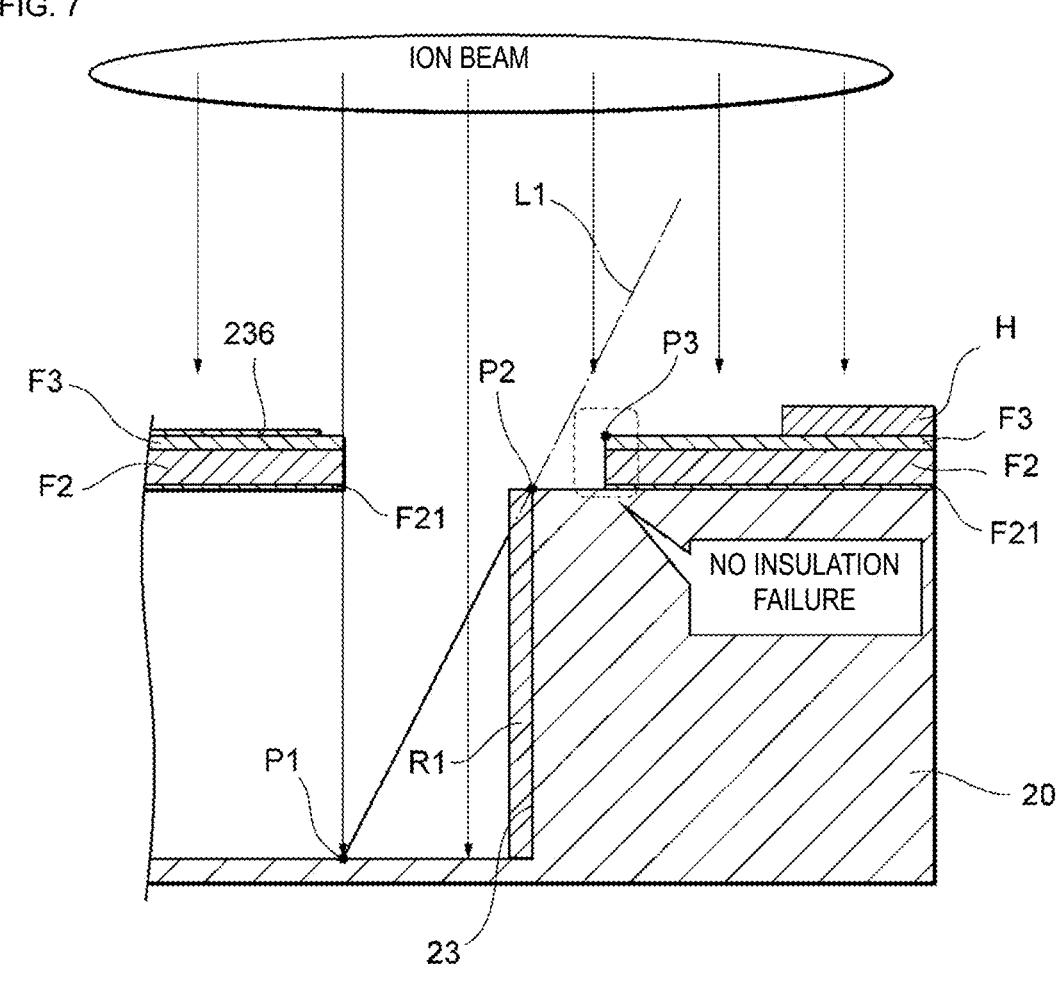
FIG. 7 is a diagram for explaining a function of the resonance device according to the first exemplary embodiment.

In this case, in the resonator 10 according to the present embodiment, when the frequency is adjusted, that is, in the example illustrated in FIG. 7, when the resonator 10 is irradiated with an ion beam having a predetermined pulse width, fragments of the vibration arm 135 scatter in a proceeding direction of the ion beam. Then, the scattering fragments rebound on the bottom surface of the recessed portion 21 of the lower lid 20. In this case, the range in which the fragments scatter is limited to an area in an inner-side portion of the resonator 10 with respect to the straight line L1. In the example illustrated in the same figure, the range in which the fragments scatter is limited to a range R1 from the bottom portion of the recessed portion 21 of the lower lid 20 facing the tip portion of the vibration arm 135 to the cavity edge. Therefore, the fragments scattering from the vibration arm 135 are less likely to be attached to the inner end portion P3 of the resonator 10 on the piezoelectric thin film F3, and occurrence of an insulation failure on the piezoelectric thin film F3 is suppressed.

In the resonator 10 according to the present embodiment, the facing portion of the holding portion 140 is located in the outer-side portion of the resonator 10 with respect to the straight line L1 connecting the intersection point P1 of the perpendicular extending from the tip portion of the vibration arm 135 toward the recessed portion 21 of the lower lid 20 and the recessed portion 21 of the lower lid 20, to the cavity edge P2 of the recessed portion 21 facing the tip portion of the vibration arm 135. As a result, when the frequency of the resonator 10 is adjusted, fragments scattering from the vibration arm 135 are less likely to be attached to the facing portion of the holding portion 140 and occurrence of an insulation failure in the facing portion can be suppressed.

Second Exemplary Embodiment

In a second embodiment and the following embodiments, description of matters common to the first embodiment will be omitted, and only differences will be described. In particular, the same effects by the same configurations will not be mentioned each time for each embodiment.

Figure 8:
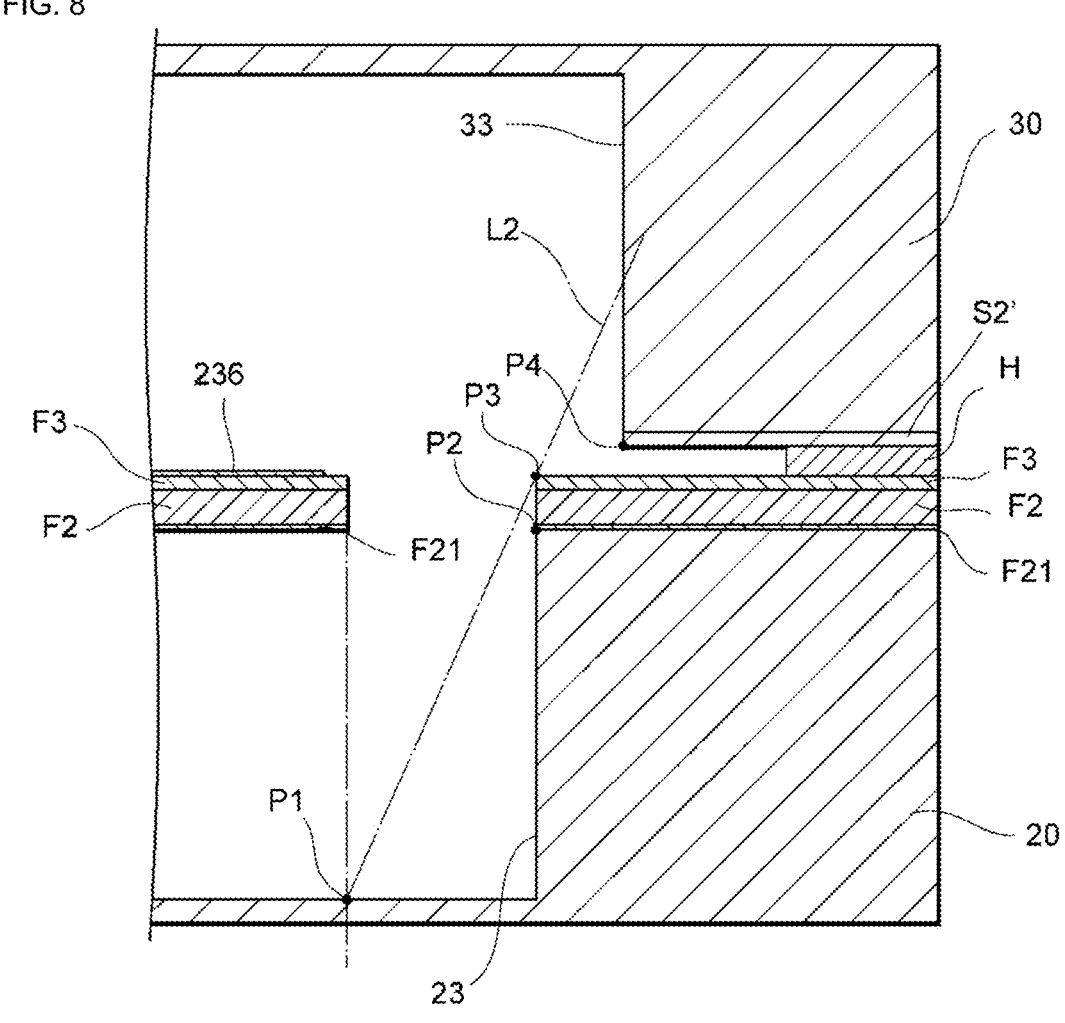
FIG. 8 is a diagram schematically illustrating a main part of a resonance device according to a second exemplary embodiment.

FIG. 8 is a plan view schematically illustrating an example of a structure of the resonator 10 according to the present embodiment. Hereinafter, in the detailed configura-tion of the resonator 10 according to the present embodi-ment, differences from the first embodiment will be mainly described. In the resonator 10 according to the present embodiment, the positional relation with the upper lid 30 and the positional relation with the lower lid 20 are different from those of the first embodiment.

As illustrated in FIG. 8, in the present embodiment, in the resonator 10, a cavity edge P4 of the recessed portion 31 of the upper lid 30 facing the tip portion of the vibration arm 135 is located in an outer-side portion of the resonator 10 with respect to a straight line L2 connecting the intersection point P1 of a perpendicular extending from the tip portion of the vibration arm 135 toward the recessed portion 21 of the lower lid 20 and the recessed portion 21 of the lower lid 20, to a cavity edge P3 of the recessed portion 21 facing the tip portion of the vibration arm 135. Specifically, on the silicon oxide layer S2' formed on the surface, of the upper lid 30, facing the resonator 10, the cavity edge P4 of the recessed portion 31 of the upper lid 30 is located in the outer-side portion of the resonator 10 with respect to the straight line L2.

Figure 9:
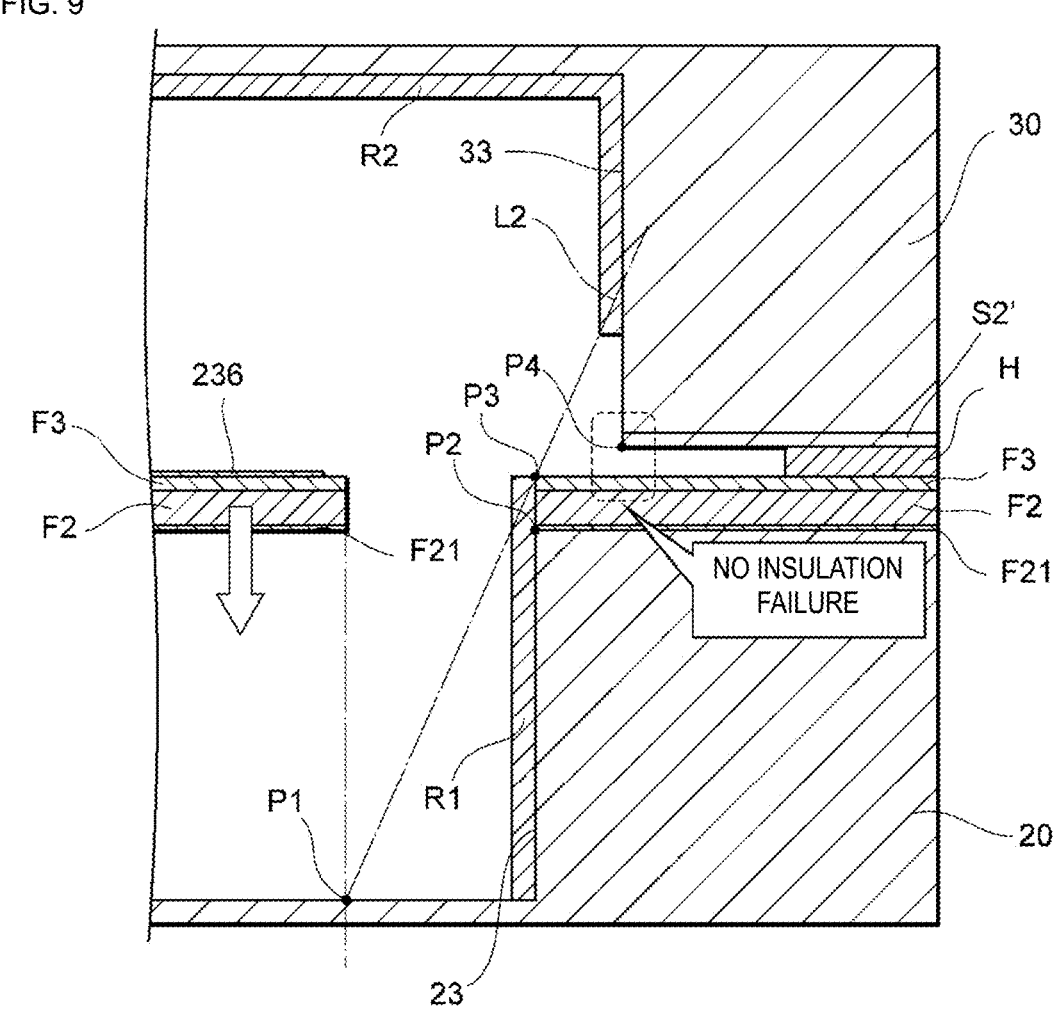
FIG. 9 is a diagram for explaining a function of the resonance device according to the second exemplary embodiment.

In this case, in the resonator 10 according to the present embodiment, when the frequency is adjusted, that is, in the example illustrated in FIG. 9, when the vibration arm 135 is excessively excited, the adjustment film 236 of the vibration arm 135 collides with the bottom plate 22 of the lower lid 20, and fragments of the vibration arm 135 scatter from the bottom surface of the recessed portion 21 of the lower lid 20. In this case, the range in which the fragments scatter is limited to an area in an inner-side portion of the resonator 10 with respect to the straight line L2. In the example illustrated in FIG. 9, the range in which the fragments scatter is limited to the range R1 from the bottom portion of the recessed portion 21 of the lower lid 20 facing the tip portion of the vibration arm 135 to the cavity edge and an area R2 above an intersection point of the side surface of the recessed portion 31 and the straight line L2, of the side surface and the bottom surface of the recessed portion 31 of the upper lid 30. Therefore, the fragments scattering from the vibration arm 135 are less likely to be attached to the cavity edge P4 of the recessed portion 31 of the upper lid 30, of the silicon oxide layer S2' formed on the surface, on the upper lid 30, facing the resonator 10, and occurrence of an insulation failure in the silicon oxide layer S2' can be suppressed.

Moreover, in the exemplary resonator 10, the cavity edge P4 of the recessed portion 31 of the upper lid 30 facing the tip portion of the vibration arm 135 is located in the outer-side portion of the resonator 10 with respect to the straight line L2 connecting the intersection point P1 of the perpendicular extending from the tip portion of the vibration arm 135 toward the recessed portion 21 of the lower lid 20 and the recessed portion 21 of the lower lid 20, to the cavity edge P3 of the recessed portion 21 facing the tip portion of the vibration arm 135. As a result, when the frequency of the resonator 10 is adjusted, fragments scattering from the vibration arm 135 are less likely to be attached to the cavity edge P4 of the recessed portion 31 of the upper lid 30 facing the tip portion of the vibration arm 135, and occurrence of an insulation failure in this portion can be suppressed.

Third Exemplary Embodiment

Figure 10:
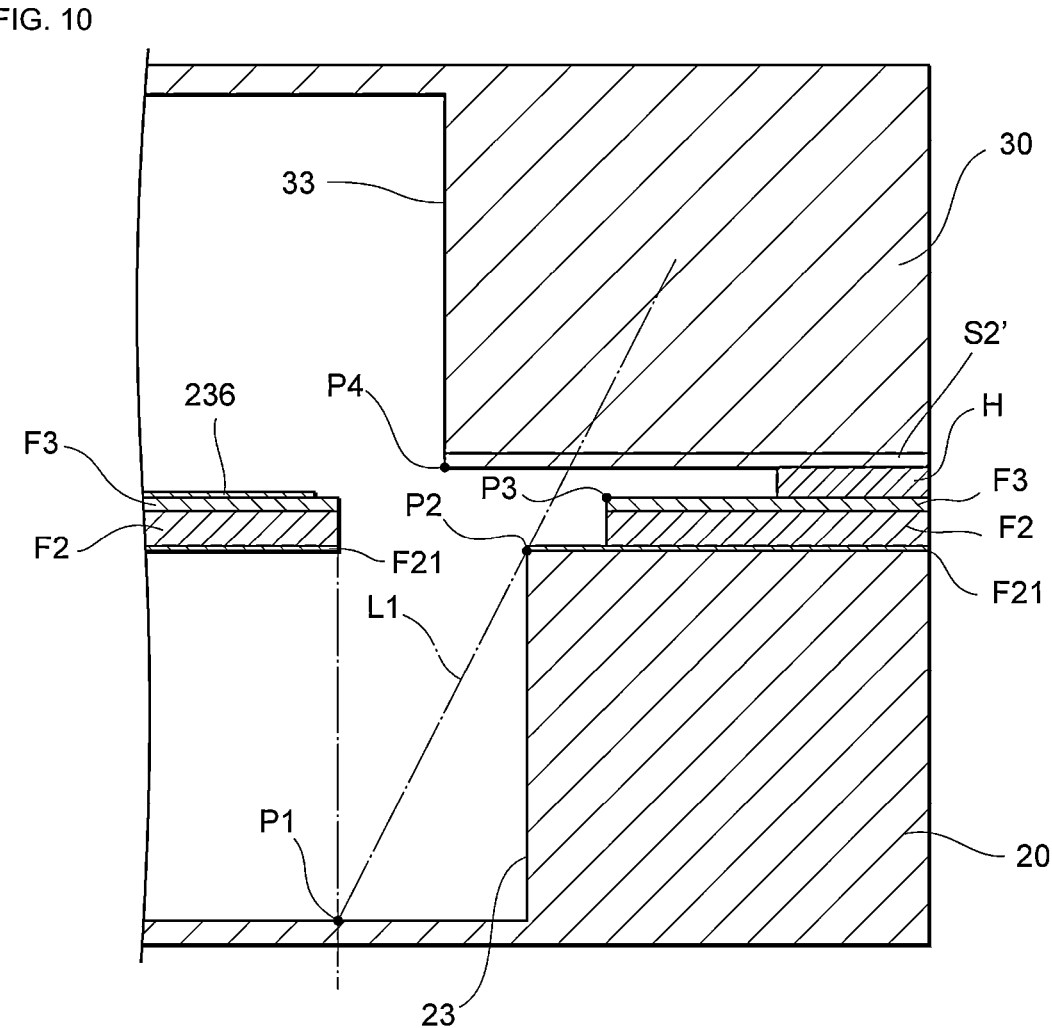
FIG. 10 is a diagram schematically illustrating a main part of a resonance device according to a third exemplary embodiment.

FIG. 10 is a plan view schematically illustrating an example of a structure of the resonator 10 according to the present embodiment. Hereinafter, in the detailed configura-tion of the resonator 10 according to the present embodi-ment, differences from the first embodiment will be mainly described. In the resonator 10 according to the present embodiment, the positional relation with the upper lid 30 and the positional relation with the lower lid 20 are different from those of the first embodiment.

As illustrated in FIG. 10, in the present embodiment, in the resonator 10, an inner end portion P3 of the resonator 10 on the piezoelectric thin film F3 is located in an outer-side portion of the resonator 10 with respect to the straight line L1 connecting the intersection point P1 of the perpendicular extending from a tip portion of the vibration arm 135 toward the recessed portion 21 of the lower lid 20 and the recessed portion 21 of the lower lid 20, to a cavity edge P2 of the recessed portion 21 facing the tip portion of the vibration arm 135. In addition, a cavity edge P4 of the recessed portion 31 of the upper lid 30 facing the tip portion of the vibration arm 135 is located in an inner-side portion of the resonator 10 with respect to the straight line L1. Specifically, on the silicon oxide layer S2' formed on the surface, of the upper lid 30, facing the resonator 10, the cavity edge P4 of the recessed portion 31 of the upper lid 30 is located in the inner-side portion of the resonator 10 with respect to the straight line L1.

Figure 11:
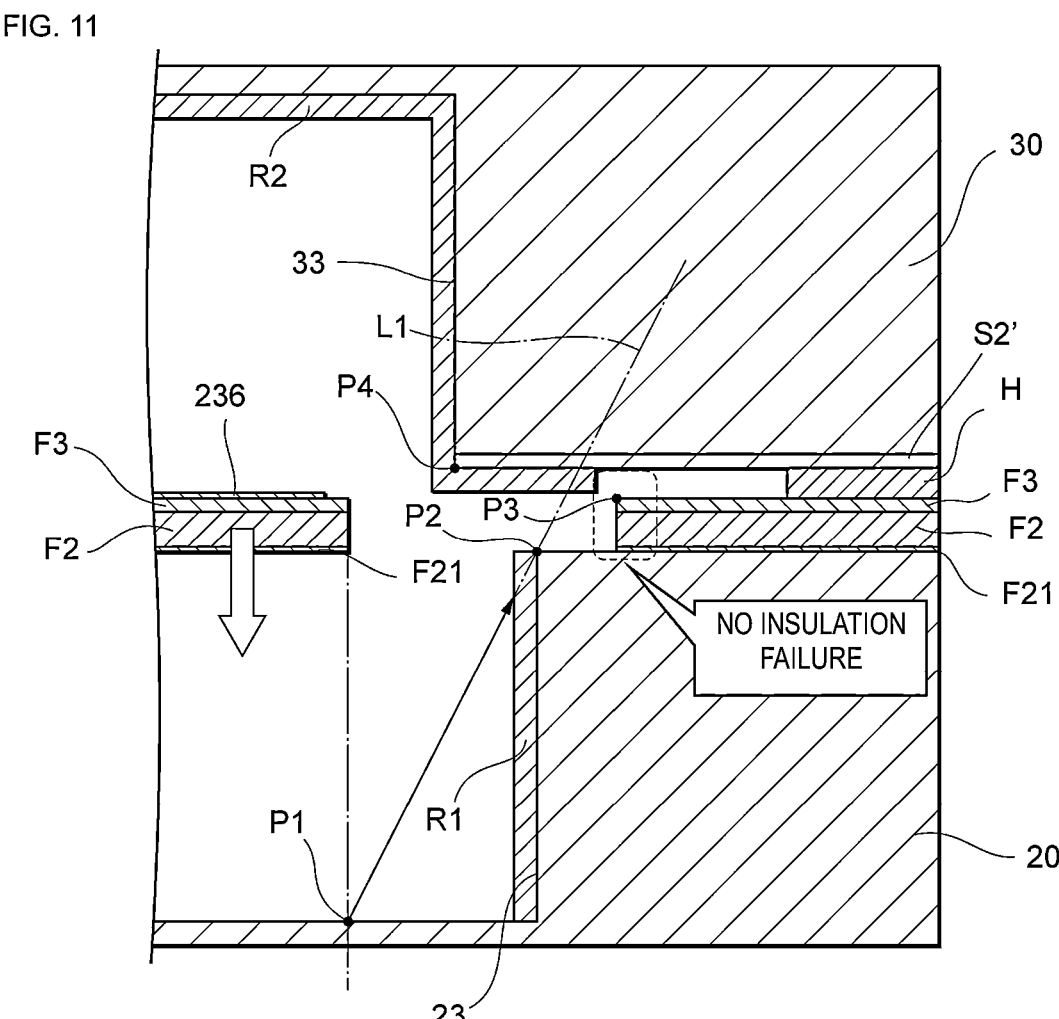
FIG. 11 is a diagram for explaining a function of the resonance device according to the third exemplary embodiment.

In this case, in the resonator 10 according to the present embodiment, when the frequency is adjusted, that is, in the example illustrated in FIG. 11, when the vibration arm 135 is excessively excited, the adjustment film 236 of the vibration arm 135 collides with the bottom plate 22 of the lower lid 20, and fragments of the vibration arm 135 scatter from the bottom surface of the recessed portion 21 of the lower lid 20. In this case, the range in which the fragments scatter is limited to an area in the inner-side portion of the resonator 10 with respect to the straight line L1. In particular, the range in which the fragments scatter is limited to the range R1 from the bottom portion of the recessed portion 21 of the lower lid 20 facing the tip portion of the vibration arm 135 to the cavity edge and the area R2 above an intersection point of the side surface of the recessed portion 31 and the straight line L1, of the side surface and the bottom surface of the recessed portion 31 of the upper lid 30. Therefore, the fragments scattering from the vibration arm 135 are less likely to be attached to the inner end portion P3 of the resonator 10 on the piezoelectric thin film F3, and occurrence of an insulation failure on the piezoelectric thin film F3 can be suppressed.

In the resonator 10 according to the present embodiment, the inner end portion P3 of the resonator 10 on the piezoelectric thin film F3 is located in the outer-side portion of the resonator 10 with respect to the straight line L1 connecting the cavity edge P2 of the recessed portion 21 facing the tip portion of the vibration arm 135, and the cavity edge P4 of the recessed portion 31 of the upper lid 30 facing the tip portion of the vibration arm 135 is located in the inner-side portion of the resonator 10 with respect to the straight line L1. As a result, when the frequency of the resonator 10 is adjusted, fragments scattering from the vibration arm 135 are less likely to be attached to the inner end portion P3 of the resonator 10 on the piezoelectric thin film F3, and occurrence of an insulation failure in this portion can be suppressed.

Fourth Exemplary Embodiment

Figure 12:
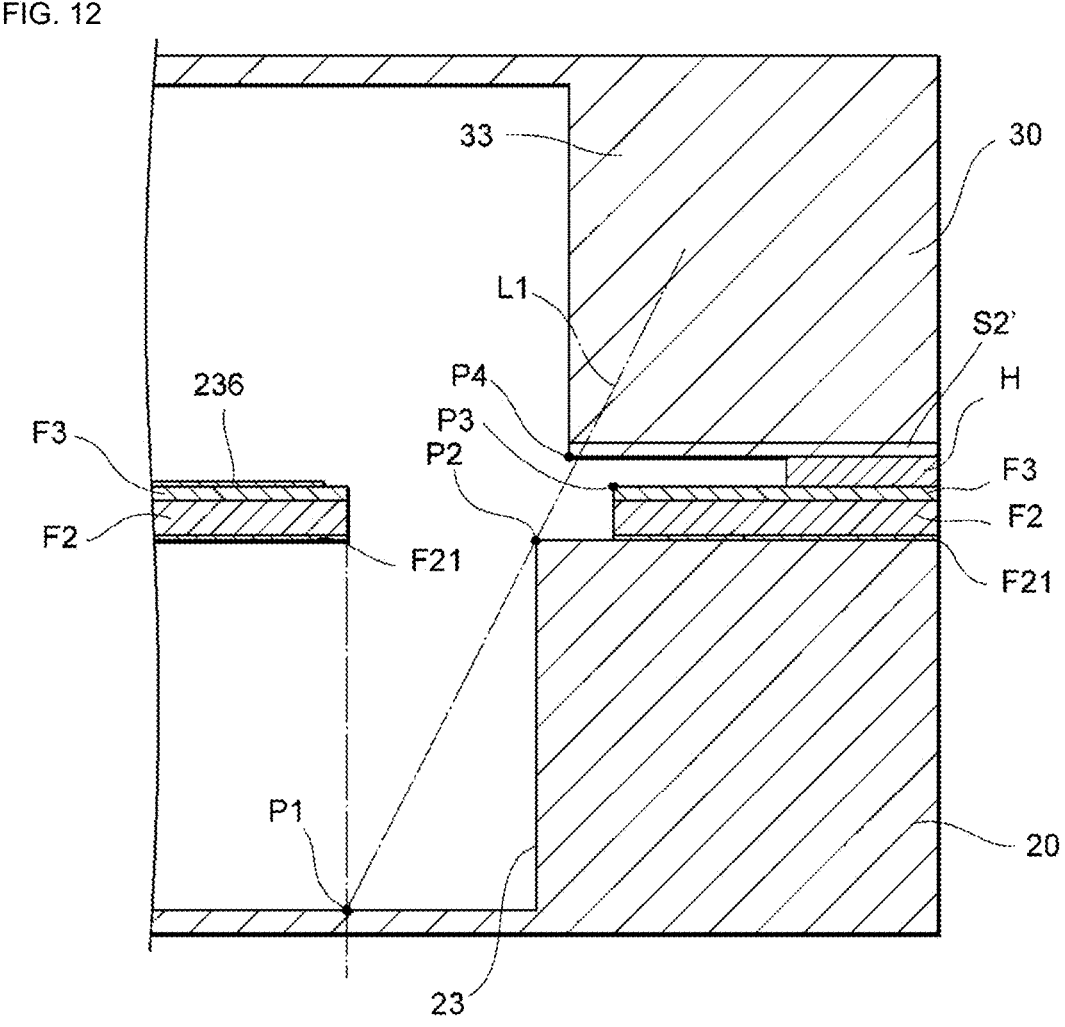
FIG. 12 is a diagram schematically illustrating a main part of a resonance device according to a fourth exemplary embodiment.

FIG. 12 is a plan view schematically illustrating an example of a structure of the resonator 10 according to the present embodiment. Hereinafter, in the detailed configuration of the resonator 10 according to the present embodiment, differences from the first embodiment will be mainly described. In the resonator 10 according to the present embodiment, the positional relation with the upper lid 30 and the positional relation with the lower lid 20 are different from those of the first embodiment.

As illustrated in FIG. 12, in the resonator 10, an inner end portion P3 of the resonator 10 on the piezoelectric thin film F3 is located in an outer-side portion of the resonator 10 with respect to the straight line L1 connecting the intersection point P1 of the perpendicular extending from a tip portion of the vibration arm 135 toward the recessed portion 21 of the lower lid 20 and the recessed portion 21 of the lower lid 20, to a cavity edge P2 of the recessed portion 21 facing the tip portion of the vibration arm 135. In addition, a cavity edge P4 of the recessed portion 31 of the upper lid 30 facing the tip portion of the vibration arm 135 is located in an inner-side portion of the resonator 10 with respect to the straight line L1. Specifically, on the silicon oxide layer S2' formed on the surface, of the upper lid 30, facing the resonator 10, an inner end portion of the resonator 10 is located in the inner-side portion of the resonator 10 with respect to the straight line L1. In addition, the cavity edge P4 of the recessed portion 31 of the upper lid 30 facing the tip portion of the vibration arm 135 is located in an outer-side portion of the resonator 10 with respect to the cavity edge P2 of the recessed portion 21 facing the tip portion of the vibration arm 135.

Figure 13:
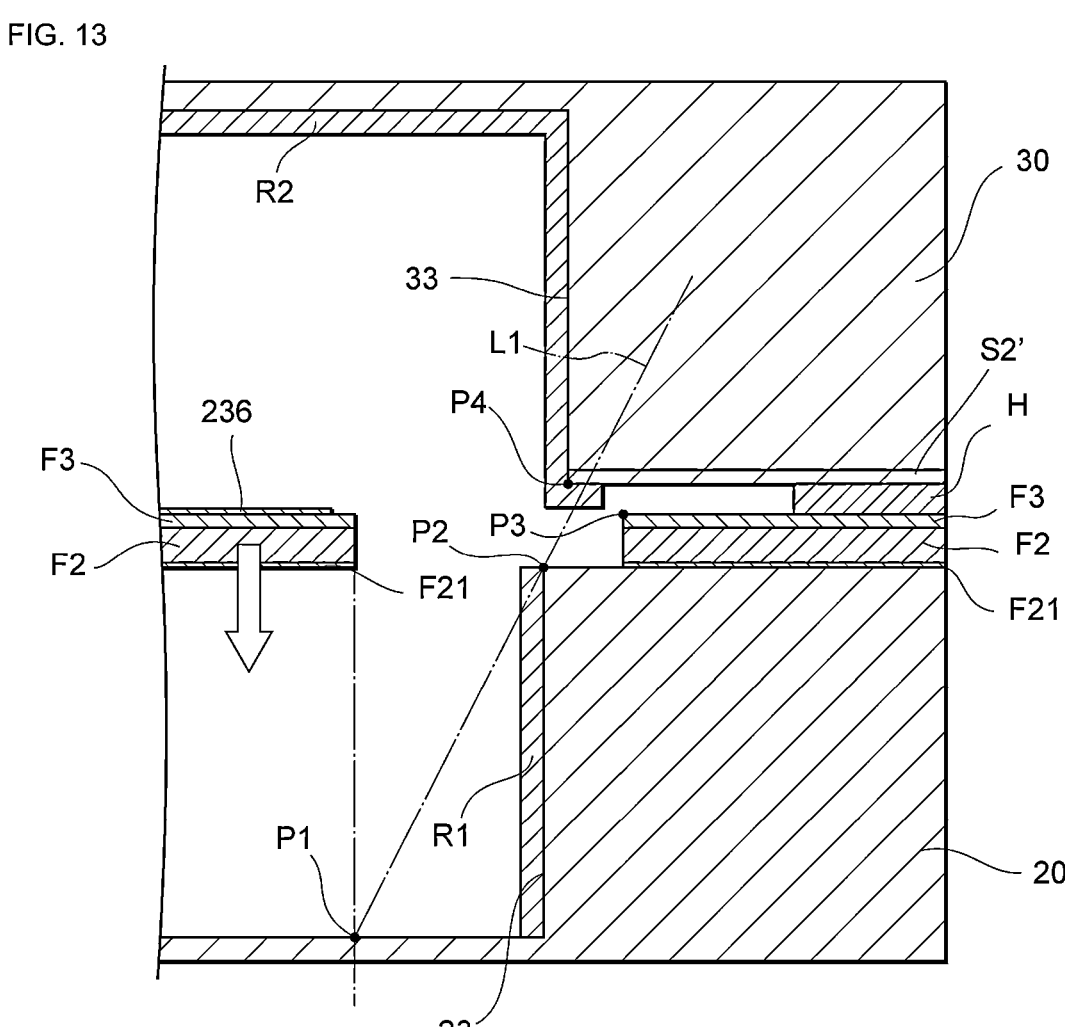
FIG. 13 is a diagram for explaining a function of the resonance device according to the fourth exemplary embodiment.

In this case, in the resonator 10 according to the present embodiment, when the frequency is adjusted, that is, in the example illustrated in FIG. 13, when the vibration arm 135 is excessively excited, the adjustment film 236 of the vibration arm 135 collides with the bottom plate 22 of the lower lid 20, and fragments of the vibration arm 135 scatter from the bottom surface of the recessed portion 21 of the lower lid 20. As shown, the range in which the fragments scatter is limited to an area in the inner-side portion of the resonator 10 with respect to the straight line L1. In particular, the range in which the fragments scatter is limited to the range R1 from the bottom portion of the recessed portion 21 of the lower lid 20 facing the tip portion of the vibration arm 135 to the cavity edge and the area R2 above the intersection point of the side surface of the recessed portion 31 and the straight line L1, of the side surface and the bottom surface of the recessed portion 31 of the upper lid 30. Therefore, the fragments scattering from the vibration arm 135 are less likely to be attached to the inner end portion P3 of the resonator 10 on the piezoelectric thin film F3, and occurrence of an insulation failure on the piezoelectric thin film F3 can be suppressed.

In addition, in the present embodiment, the inner end portion P3 of the resonator 10 on the piezoelectric thin film F3 and the cavity edge P4 of the recessed portion 31 of the upper lid 30 facing the tip portion of the vibration arm 135 are both located in the outer-side portion of the resonator 10 with respect to the cavity edge P2 of the recessed portion 21 facing the tip portion of the vibration arm 135. Therefore, the fragments scattering from the vibration arm 135 when the vibration arm 135 is excessively excited are less likely to accumulate in a gap between the peripheral portion of the upper lid 30 and the peripheral portion of the lower lid 20. Therefore, the fragments scattering from the vibration arm 135 are less likely to be attached to the inner end portion P3 of the resonator 10 on the piezoelectric thin film F3 and the cavity edge P4 of the recessed portion 31 of the upper lid 30 facing the tip portion of the vibration arm 135, and occurrence of an insulation failure can be further suppressed in these portions.

In the resonator 10 according to the present embodiment, the inner end portion P3 of the resonator 10 on the piezoelectric thin film F3 and the cavity edge P4 of the recessed portion 31 of the upper lid 30 facing the tip portion of the vibration arm 135 are both located in the outer-side portion of the resonator 10 with respect to the cavity edge P2 of the recessed portion 21 facing the tip portion of the vibration arm 135. As a result, when the frequency of the resonator 10 is adjusted, fragments scattering from the vibration arm 135 are less likely to accumulate in a gap between the peripheral portion of the upper lid 30 and the peripheral portion of the lower lid 20, and occurrence of an insulation failure in the gap can be suppressed.

Fifth Exemplary Embodiment

Figure 14:
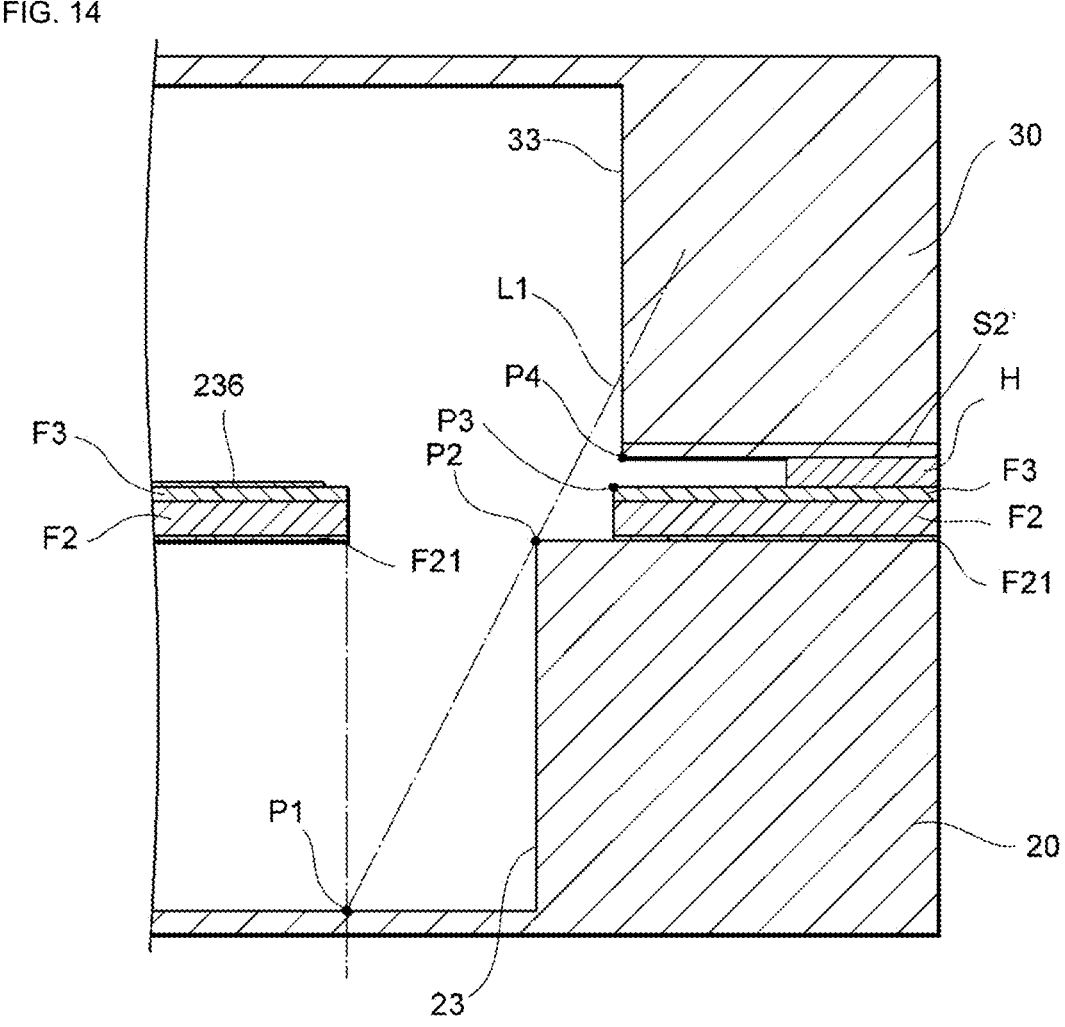
FIG. 14 is a diagram schematically illustrating a main part of a resonance device according to a fifth exemplary embodiment.

FIG. 14 is a plan view schematically illustrating an example of a structure of the resonator 10 according to the present embodiment. Hereinafter, in the detailed configuration of the resonator 10 according to the present embodiment, differences from the first embodiment will be mainly described. In the resonator 10 according to the present embodiment, the positional relation with the upper lid 30 and the positional relation with the lower lid 20 are different from those of the first embodiment.

As illustrated in FIG. 14, in the present embodiment, in the resonator 10, an inner end portion P3 of the resonator 10 on the piezoelectric thin film F3 is located in an outer-side portion of the resonator 10 with respect to the straight line L1 connecting the intersection point P1 of the perpendicular extending from a tip portion of the vibration arm 135 toward the recessed portion 21 of the lower lid 20 and the recessed portion 21 of the lower lid 20, to a cavity edge P2 of the recessed portion 21 facing the tip portion of the vibration arm 135. In addition, a cavity edge P4 of the recessed portion 31 of the upper lid 30 facing the tip portion of the vibration arm 135 is located in an outer-side portion of the resonator 10 with respect to the straight line L1. Specifically, on the silicon oxide layer S2' formed on the surface, of the upper lid 30, facing the resonator 10, an inner end portion of the resonator 10 is located in the outer-side portion of the resonator 10 with respect to the straight line L1. In addition, the cavity edge P4 of the recessed portion 31 of the upper lid 30 facing the tip portion of the vibration arm 135 is located in an outer-side portion of the resonator 10 with respect to the cavity edge P2 of the recessed portion 21 facing the tip portion of the vibration arm 135.

Figure 15:
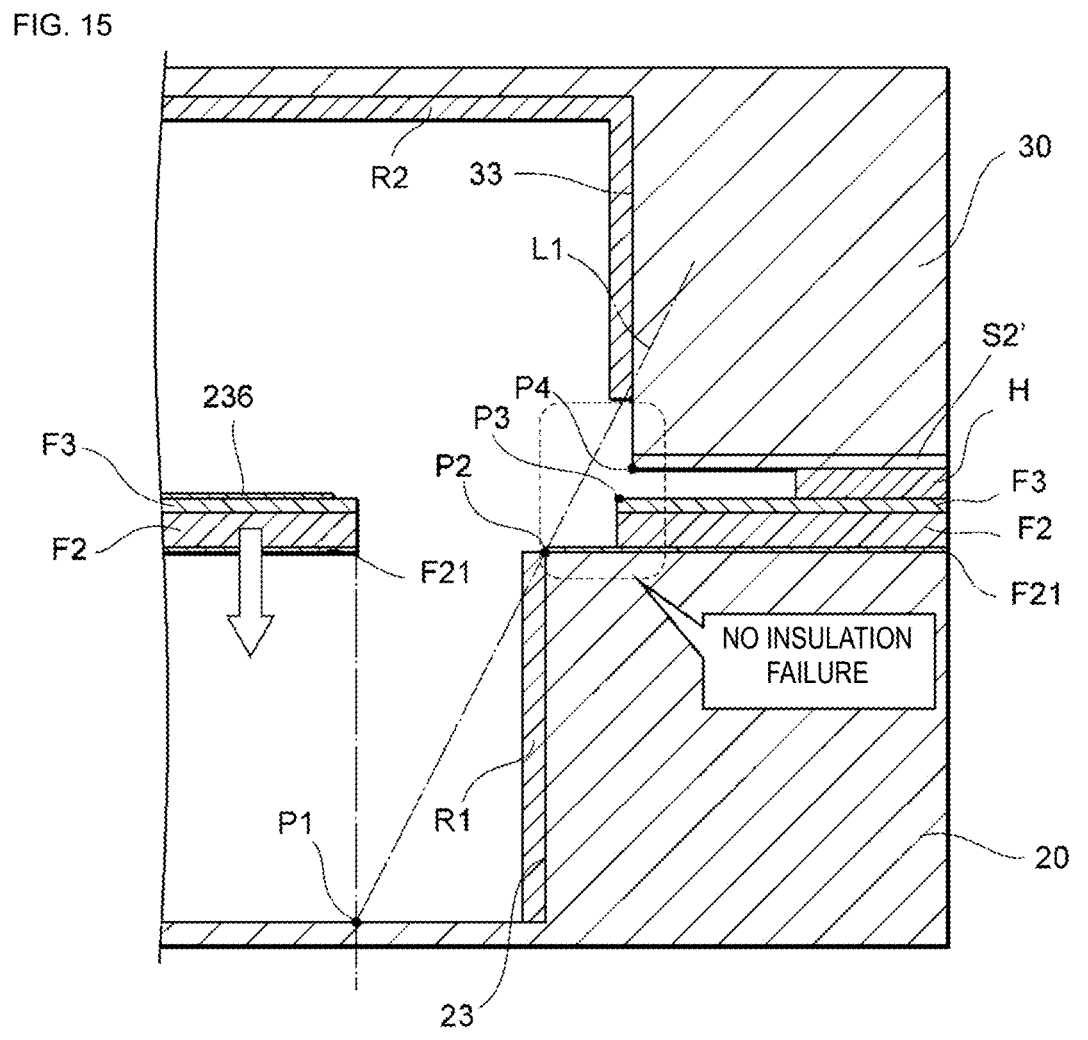

In this case, in the resonator 10, when the frequency is adjusted, that is, in the example illustrated in FIG. 15, when the vibration arm 135 is excessively excited, the adjustment film 236 of the vibration arm 135 collides with the bottom plate 22 of the lower lid 20, and fragments of the vibration arm 135 scatter from the bottom surface of the recessed portion 21 of the lower lid 20. In this case, the range in which the fragments scatter is limited to an area in the inner-side portion of the resonator 10 with respect to the straight line L1. In particular, the range in which the fragments scatter is limited to the range R1 from the bottom portion of the recessed portion 21 of the lower lid 20 facing the tip portion of the vibration arm 135 to the cavity edge and the area R2 above the intersection point of the side surface of the recessed portion 31 and the straight line L1, of the side surface and the bottom surface of the recessed portion 31 of the upper lid 30. Therefore, the fragments scattering from the vibration arm 135 are less likely to be attached to the inner end portion P3 of the resonator 10 on the piezoelectric thin film F3 and the cavity edge P4 of the recessed portion 31 of the upper lid 30 facing the tip portion of the vibration arm 135, and occurrence of an insulation failure on the piezoelectric thin film F3 can be suppressed.

In addition, in the present embodiment, the inner end portion P3 of the resonator 10 on the piezoelectric thin film F3 and the cavity edge P4 of the recessed portion 31 of the upper lid 30 facing the tip portion of the vibration arm 135 are both located in the outer-side portion of the resonator 10 with respect to the cavity edge P2 of the recessed portion 21 facing the tip portion of the vibration arm 135. Therefore, fragments scattering from the vibration arm 135 when the vibration arm 135 is excessively excited are less likely to accumulate in a gap between the peripheral portion of the upper lid 30 and the peripheral portion of the lower lid 20. Therefore, the fragments scattering from the vibration arm 135 are less likely to be attached to the inner end portion P3 of the resonator 10 on the piezoelectric thin film F3 and the cavity edge P4 of the recessed portion 31 of the upper lid 30 facing the tip portion of the vibration arm 135, and occurrence of an insulation failure can be further suppressed in these portions.

Sixth Exemplary Embodiment

Figure 16:
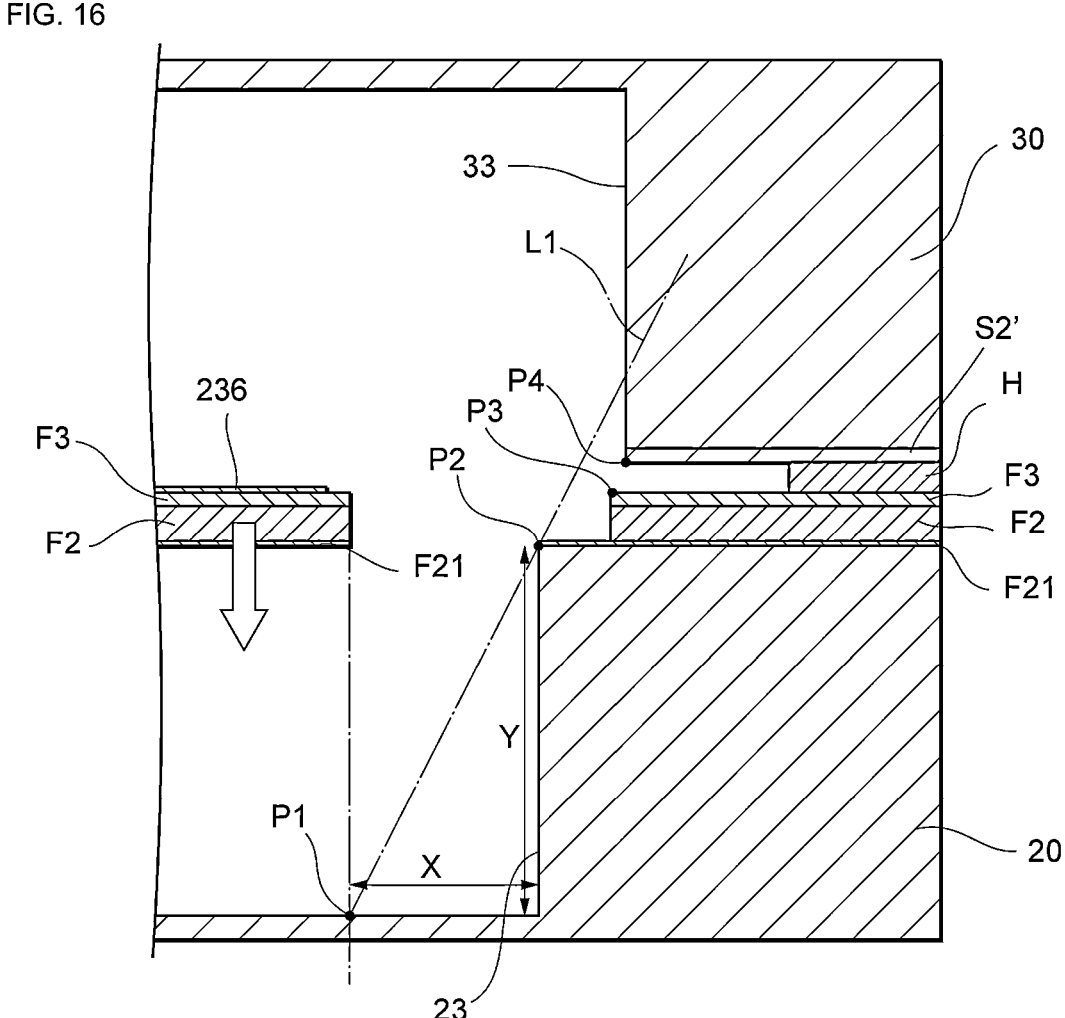
FIG. 16 is a diagram schematically illustrating a main part of a resonance device according to a sixth exemplary embodiment.

FIG. 16 is a plan view schematically illustrating an example of a structure of the resonator 10 according to the present embodiment. Hereinafter, in the detailed configuration of the resonator 10 according to the present embodiment, differences from the first embodiment will be mainly described. In the resonator 10 according to the present embodiment, the positional relation with the upper lid 30 and the positional relation with the lower lid 20 are different from those of the first embodiment.

As illustrated in FIG. 16, in the resonator 10, an inner end portion P3 of the resonator 10 on the piezoelectric thin film F3 is located in an outer-side portion of the resonator 10 with respect to the straight line L1 connecting the intersection point P1 of the perpendicular extending from a tip portion of the vibration arm 135 toward the recessed portion 21 of the lower lid 20 and the recessed portion 21 of the lower lid 20, to a cavity edge P2 of the recessed portion 21 facing the tip portion of the vibration arm 135. In addition, a cavity edge P4 of the recessed portion 31 of the upper lid 30 facing the tip portion of the vibration arm 135 is located in the outer-side portion of the resonator 10 with respect to the straight line L1. Specifically, on the silicon oxide layer S2' formed on the surface, of the upper lid 30, facing the resonator 10, an inner end portion of the resonator 10 is located in the outer-side portion of the resonator 10 with respect to the straight line L1. In addition, the cavity edge P4 of the recessed portion 31 of the upper lid 30 facing the tip portion of the vibration arm 135 is located in an outer-side portion of the resonator 10 with respect to the cavity edge P2 of the recessed portion 21 facing the tip portion of the vibration arm 135.

In addition, in the present embodiment, in the resonator 10, when X represents a horizontal distance between the intersection point P1 of the perpendicular extending from a tip portion of the vibration arm 135 toward the recessed portion 21 of the lower lid 20 and the recessed portion 21 of the lower lid 20, and the cavity edge P2 of the recessed portion 21 facing the tip portion of the vibration arm 135, and Y represents the difference in height between the intersection point P1 and the cavity edge P2 of the recessed portion 21, $0.1 \leq X/Y \leq 2.0$ is satisfied, and preferably, $0.3 \leq X/Y \leq 0.7$ is satisfied. That is, in the resonator 10, by satisfying $0.1 \leq X/Y$, and preferably $0.3 \leq X/Y$, fragments scattering from the vibration arm 135 excessively attaching to an inner surface of the recessed portion 21 of the lower lid 20 can be suppressed. In addition, in the resonator 10, by satisfying $X/Y \leq 2.0$, and preferably $X/Y \leq 0.7$, the fragments excessively attaching thereto can be suppressed as described above, and the resonator 10 can be reduced in size.

In the resonator 10 according to the present embodiment, when X represents the horizontal distance between the intersection point P1 of the perpendicular extending from a tip portion of the vibration arm 135 toward the recessed portion 21 of the lower lid 20 and the recessed portion 21 of the lower lid 20, and the cavity edge P2 of the recessed portion 21 facing the tip portion of the vibration arm 135, and Y represents the difference in height between the intersection point P1 and the cavity edge P2 of the recessed portion 21, 0.1≤X/Y≤2.0 is satisfied, and preferably, 0.3≤X/Y≤0.7 is satisfied. Therefore, the fragments scattering from the vibration arm 135 excessively attaching to the inner surface of the recessed portion 21 of the lower lid 20 can be suppressed, and the resonator 10 can be reduced in size.

Hereinafter, a part or all of the embodiments of the present invention will be noted as supplemental remarks, and the effects thereof will be described. It is generally noted that the present invention is not limited to the following notes.

According to an exemplary aspect, a resonance device is provided that includes a lower lid that has a first recessed portion, and a resonator that is mounted on the lower lid and has a vibration arm that is configured to perform out-of-plane bending vibration in a space including the first recessed portion and a frame disposed around the vibration arm and having a facing portion facing a tip of the vibration arm, and the facing portion of the frame is located in an outer-side portion of the resonator with respect to a straight line connecting an intersection point of a perpendicular extending from the tip of the vibration arm toward the first recessed portion of the lower lid and the first recessed portion of the lower lid, to a cavity edge of the first recessed portion facing the tip portion of the vibration arm.

As an exemplary aspect, the resonance device further includes an upper lid that has a second recessed portion and is disposed in a direction in which the second recessed portion faces the first recessed portion of the lower lid, and the resonator is disposed between the upper lid and the lower lid, and the vibration arm is configured to perform out-of-plane bending vibration in a space including the second recessed portion of the upper lid and the first recessed portion of the lower lid.

As an exemplary aspect of the resonance device, a cavity edge of the second recessed portion facing the tip of the vibration arm is located in an inner-side portion of the resonator with respect to the cavity edge of the first recessed portion facing the tip of the vibration arm.

As an exemplary aspect of the resonance device, a cavity edge of the second recessed portion facing the tip of the vibration arm is located in an outer-side portion of the resonator with respect to the cavity edge of the first recessed portion facing the tip of the vibration arm.

As an exemplary aspect of the resonance device, a cavity edge of the second recessed portion facing the tip of the vibration arm is located in the outer-side portion of the resonator with respect to the straight line.

As an exemplary aspect, a resonance device includes a lower lid that has a first recessed portion, an upper lid that has a second recessed portion and is disposed in a direction in which the second recessed portion faces the first recessed portion of the lower lid, a resonator that is disposed between the upper lid and the lower lid and has a vibration arm configured to perform out-of-plane bending vibration in a space including the first recessed portion of the lower lid and the second recessed portion of the upper lid, and a frame disposed around the vibration arm and having a facing portion facing a tip of the vibration arm, and a cavity edge of the second recessed portion facing the tip of the vibration arm is located in an outer-side portion of the resonator with respect to a straight line connecting an intersection point of a perpendicular extending from the tip of the vibration arm toward the first recessed portion of the lower lid and the first recessed portion of the lower lid, to a cavity edge of the first recessed portion facing the tip of the vibration arm.

As an exemplary aspect of the resonance device, 0.1≤X/Y≤2.0 is satisfied, where X represents a horizontal distance between the intersection point of the perpendicular extending from the tip of the vibration arm toward the first recessed portion of the lower lid and the first recessed portion of the lower lid, and the cavity edge of the first recessed portion facing the tip of the vibration arm, and Y represents a difference in height between the intersection point of the perpendicular extending from the tip of the vibration arm toward the first recessed portion of the lower lid and the first recessed portion of the lower lid, and the cavity edge of the first recessed portion facing the tip of the vibration arm.

As an exemplary aspect of the resonance device, 0.3≤X/Y≤0.7 is satisfied.

As described above, according to an exemplary aspect, when the resonant frequency of the vibration arm is adjusted, occurrence of an insulation failure due to a scattering object from the vibration arm is suppressed.

In general, it is noted that the embodiments described above are intended to facilitate understanding of the present invention and are not intended to limit and interpret the present invention. The exemplary embodiments of the present invention can be changed and improved without departing from the gist thereof, and the present invention includes equivalents thereof. That is, those in which the person skilled in the art has appropriately changed the design of each embodiment is also included in the scope of the exemplary embodiments of the present invention as long as the features of the present invention are included. For example, each element included in each embodiment and its disposition, material, condition, shape, size, and the like are not limited to those illustrated, and may be changed appropriately. In addition, respective elements included in respective embodiments can be combined as far as technically possible, and a combination thereof is included in the scope of the present invention as long as it includes the features of the present invention.

REFERENCE SIGNS LIST

1 RESONANCE DEVICE
10 RESONATOR
30 UPPER LID
20 LOWER LID
140 HOLDING PORTION
120 VIBRATION PORTION
130 BASE PORTION
135A-135D VIBRATION ARM
F2 Si SUBSTRATE
235 PROTECTION FILM
236 ADJUSTMENT FILM

The invention claimed is:
1. A resonance device comprising:
a first lid that has a first recessed portion;
a resonator mounted on the first lid and having at least one vibration arm configured to vibrate in a space including the first recessed portion;
a second lid that has a second recessed portion that faces the first recessed portion of the first lid; and
a frame that is disposed between the first lid and the second lid and is further disposed around the at least one vibration arm and that has a facing portion that faces a tip of the at least one vibration arm, wherein a cavity edge of the first recessed portion faces the tip of the at least one vibration arm in a horizontal direction in which the at least one vibration arm extends, wherein a perpendicular that extends from the tip of the at least one vibration arm towards the first recessed portion intersects an inner surface of the first lid at an intersection point, and wherein the second lid has a smaller thickness in the horizontal direction than a thickness of the first lid in the horizontal direction, such that the facing portion of the frame is located in an outer-side of a straight line that connects the intersection point and the cavity edge and extends to a side surface of the second lid.

2. The resonance device according to claim 1, wherein the at least one vibration arm is configured to vibrate by performing an out-of-plane bending vibration in the space.

3. The resonance device according to claim 1, wherein the second recessed portion of the second lid is disposed in a direction in which the second recessed portion faces the first recessed portion of the first lid, such that the resonator is disposed between the second lid and the first lid.

4. The resonance device according to claim 3, wherein the at least one vibration arm is configured to perform an out-of-plane bending vibration in a space that includes the second recessed portion of the second lid and the first recessed portion of the first lid.

5. The resonance device according to claim 3, wherein a cavity edge of the second recessed portion facing the tip of the at least one vibration arm is located in an outer-side portion of the resonator with respect to the cavity edge of the first recessed portion facing the tip of the at least one vibration arm.

6. The resonance device according to claim 3, wherein a cavity edge of the second recessed portion facing the tip of the at least one vibration arm is located in the outer-side portion of the resonator with respect to the straight line.

7. The resonance device according to claim 1, wherein the perpendicular extends in a thickness direction of the resonance device and the cavity edge of the first recessed portion faces the tip of the at least one vibration arm in the horizontal direction that is orthogonal to the thickness direction.

8. The resonance device according to claim 3, wherein 0.1≤X/Y≤2.0 is satisfied, and wherein X represents a horizontal distance between the intersection point of the perpendicular extending from the tip of the at least one vibration arm toward the first recessed portion of the first lid and the first recessed portion of the first lid, and the cavity edge of the first recessed portion facing the tip of the vibration arm, and Y represents a difference in height between the intersection point of the perpendicular extending from the tip of the at least one vibration arm towards the first recessed portion of the first lid and the first recessed portion of the first lid, and the cavity edge of the first recessed portion facing the tip of the at least one vibration arm.

9. The resonance device according to claim 8, wherein 0.3≤X/Y≤0.7 is satisfied.

10. A resonance device comprising:

a lower lid that has a first recessed portion;

an upper lid that has a second recessed portion and is disposed such that the second recessed portion faces the first recessed portion of the lower lid; and a resonator disposed between the upper lid and the lower lid and that has at least one vibration arm configured to vibrate in a space defined by the first and second recessed portions, and a frame disposed around the at least one vibration arm and having a facing portion that faces a tip of the at least one vibration arm, wherein a first cavity edge of the first recessed portion faces the tip of the at least one vibration arm in a horizontal direction in which the at least one vibration arm extends, wherein a perpendicular that extends from the tip of the at least one vibration arm towards the first recessed portion intersects an inner surface of the lower lid at an intersection point, and wherein the upper lid has a smaller thickness in the horizontal direction than a thickness of the lower lid in the horizontal direction, such that a second cavity edge of the second recessed portion that faces the tip of the at least one vibration arm is located in an outer-side portion of a straight line that connects the intersection point and the first cavity edge of the first recessed portion and extends to a side surface of the upper lid.

11. The resonance device according to claim 10, wherein the at least one vibration arm is configured to vibrate by performing an out-of-plane bending vibration in the space defined by the first and second recessed portions.

12. The resonance device according to claim 10, wherein the second cavity edge of the second recessed portion is located in an outer-side portion of the resonator with respect to the first cavity edge of the first recessed portion that faces the tip of the at least one vibration arm.

13. The resonance device according to claim 10, wherein the second cavity edge of the second recessed portion is located in the outer-side portion of the resonator with respect to the straight line.

14. The resonance device according to claim 10, wherein the perpendicular extends in a thickness direction of the resonance device and the first cavity edge of the first recessed portion faces the tip of the at least one vibration arm in the horizontal direction that is orthogonal to the thickness direction.

15. The resonance device according to claim 10, wherein 0.1≤X/Y≤2.0 is satisfied, and wherein X represents a horizontal distance between the intersection point of the perpendicular extending from the tip of the at least one vibration arm toward the first recessed portion of the first lid and the first recessed portion of the first lid, and the first cavity edge of the first recessed portion facing the tip of the vibration arm, and Y represents a difference in height between the intersection point of the perpendicular extending from the tip of the at least one vibration arm towards the first recessed portion of the first lid and the first recessed portion of the first lid, and the first cavity edge of the first recessed portion facing the tip of the at least one vibration arm.

16. The resonance device according to claim 15, wherein 0.3≤X/Y≤0.7 is satisfied.

17. A resonance device comprising:

a first lid that has a first recessed portion;

a second lid that has a second recessed portion that faces the first recessed portion of the first lid; and a resonator disposed between the first lid and the second lid and having at least one vibration arm that extends in a space that includes at least the first recessed portion, and a frame that is disposed around the at least one vibration arm and that has a facing portion that faces a tip of the at least one vibration arm, wherein a cavity edge of the first recessed portion faces the tip of the at least one vibration arm in a horizontal direction in which the at least one vibration arm extends, wherein a perpendicular that extends from the tip of the at least one vibration arm towards the first recessed portion intersects an inner surface of the first lid at an intersection point, and wherein the second lid has a smaller thickness in the horizontal direction than a thickness of the first lid in the horizontal direction, such that the facing portion of the frame is located in an outer-side of a straight line that connects the intersection point and the cavity edge of the first recessed portion and extends to a side surface of the second lid.

18. The resonance device according to claim 17, wherein the perpendicular extends in a thickness direction of the resonance device and the cavity edge of the first recessed portion faces the tip of the at least one vibration arm in the horizontal direction that is orthogonal to the thickness direction.

19. The resonance device according to claim 17, wherein $0.1 \leq X/Y \leq 2.0$ is satisfied, and wherein X represents a horizontal distance in the horizontal direction between the intersection point and the cavity edge of the first recessed portion, and Y represents a difference in height between the intersection point and the cavity edge of the first recessed portion facing the tip of the at least one vibration arm in the horizontal direction.

20. The resonance device according to claim 19, wherein $0.3 \leq X/Y \leq 0.7$ is satisfied.

* * * * *